(12) United States Patent
Miller et al.

(10) Patent No.: US 10,211,865 B1
(45) Date of Patent: Feb. 19, 2019

(54) FULLY DIFFERENTIAL ADJUSTABLE GAIN DEVICES AND METHODS FOR USE THEREWITH

(71) Applicant: Futurewei Technologies, Inc., Plano, TX (US)

(72) Inventors: Matthew R. Miller, Arlington Heights, IL (US); Paul R. Ganci, Golden, CO (US)

(73) Assignee: Futurewei Technologies, Inc., Plano, TX (US)

( * ) Notice: Subject to any disclaimer, the term of this patent is extended or adjusted under 35 U.S.C. 154(b) by 0 days.

(21) Appl. No.: 16/015,926

(22) Filed: Jun. 22, 2018

(51) Int. Cl.
*H04B 1/28* (2006.01)
*H04B 1/16* (2006.01)
(Continued)

(52) U.S. Cl.
CPC ............... *H04B 1/16* (2013.01); *H03D 7/12* (2013.01); *H03F 3/19* (2013.01); *H03F 3/45071* (2013.01); *H03G 3/3052* (2013.01); *H03H 11/126* (2013.01); *H03H 11/28* (2013.01); *H03D 2200/0025* (2013.01); *H03F 2200/129* (2013.01); *H03F 2200/144* (2013.01); *H03F 2200/171* (2013.01); *H03F 2200/222* (2013.01); *H03F 2200/267* (2013.01); *H03F 2200/294* (2013.01); *H03F 2200/331* (2013.01);
(Continued)

(58) Field of Classification Search
CPC .... H04B 1/16; H04B 1/26; H03D 7/12; H03F 3/19; H03F 3/193; H03F 3/45; H03F 3/45071; H03G 3/3052; H03G 3/3068; H03H 11/126; H03H 11/1217; H03H 11/28
See application file for complete search history.

(56) References Cited

U.S. PATENT DOCUMENTS

| 5,867,778 A * | 2/1999 | Khoury | H03D 7/1433 327/359 |
|---|---|---|---|
| 8,761,707 B1 | 6/2014 | Connell et al. | |
| 8,928,407 B2 | 1/2015 | Miller et al. | |
| 9,263,993 B2 * | 2/2016 | Peng | H03F 1/26 |

(Continued)

OTHER PUBLICATIONS

U.S. Appl. No. 16/016,081, filed Jun. 22, 2018.

*Primary Examiner* — Thanh Le
(74) *Attorney, Agent, or Firm* — Vierra Magen Marcus LLP

(57) ABSTRACT

The disclosure relates to technology for a fully differential adjustable gain device that includes differential input terminals, differential output terminals, fully differential signal processing circuitry, and first and second cross-coupled segments. The first cross-coupled segment is coupled between differential input terminals of the fully differential adjustable gain device and a negative input of the fully differential signal processing circuitry. The second cross-coupled segment is coupled between differential input terminals of the fully differential adjustable gain device and a positive input of the fully differential signal processing circuitry. The fully differential adjustable gain device has a gain that is adjustable by adjusting values of the first and second cross-coupled segments, while maintaining a substantially consistent frequency response and a substantially consistent input impedance of the fully differential adjustable gain device, so long as a specified relationship between values of the first and second cross-coupled segments is kept substantially constant.

20 Claims, 13 Drawing Sheets

(51) Int. Cl.
    *H03H 11/12*     (2006.01)
    *H03F 3/45*     (2006.01)
    *H03F 3/19*     (2006.01)
    *H03D 7/12*     (2006.01)
    *H03H 11/28*     (2006.01)
    *H03G 3/30*     (2006.01)

(52) U.S. Cl.
    CPC .. *H03F 2200/387* (2013.01); *H03F 2200/451* (2013.01); *H03F 2203/45116* (2013.01); *H03F 2203/45512* (2013.01); *H03F 2203/45526* (2013.01); *H03F 2203/45528* (2013.01); *H03F 2203/45576* (2013.01)

(56) References Cited

U.S. PATENT DOCUMENTS

| | | | | |
|---|---|---|---|---|
| 2007/0018727 | A1* | 1/2007 | Lee | H03F 3/19 |
| | | | | 330/254 |
| 2012/0021712 | A1* | 1/2012 | Mikhemar | H03F 1/086 |
| | | | | 455/234.1 |
| 2017/0117861 | A1 | 4/2017 | Jaeger et al. | |

\* cited by examiner

FULLY DIFFERENTIAL ADJUSTABLE GAIN DEVICES AND METHODS FOR USE THEREWITH

CROSS-REFERENCE

This application is related to commonly invented and commonly assigned U.S. patent application Ser. No. 16/016,081, filed Jun. 22, 2018 which is incorporated herein by reference.

FIELD

The disclosure generally relates to fully differential adjustable gain devices and methods for use therewith. A fully differential adjustable gain device can be, e.g., fully differential filter, a fully differential variable gain amplifier, a fully differential mixer, or a fully differential analog-to-digital converter, but is not limited thereto. This disclosure also relates to receivers that include one or more fully differential adjustable gain devices.

BACKGROUND

Receivers included in user equipment (UE) or base stations (BSs) of wireless networks often include filters and variable gain amplifiers that are fully differential circuits. Such fully differential devices typically include both active components, such as fully differential operational amplifiers (op-amps), as well as passive components, such as resistors and/or capacitors. It is often beneficial or otherwise desirable for such fully differential devices to have adjustable gains, with well controlled gain steps. However, the input impedance and the frequency response of a fully differential device is typically changed whenever the gain of the fully differential circuit is adjusted, which is undesirable.

BRIEF SUMMARY

According to one aspect of the present disclosure, there is provided a fully differential adjustable gain device comprising fully differential input terminals, fully differential output terminals, fully differential signal processing circuitry, and first and second cross coupled segments. The differential input terminals of the fully differential adjustable gain device include a negative (−) input terminal and a positive (+) input terminal. The differential output terminals of the fully differential adjustable gain device include a positive (+) output terminal and a negative (−) output terminal. The fully differential signal processing circuitry include differential inputs and differential outputs, the differential inputs including a negative (−) input and a positive (+) input, and the differential outputs including a positive (+) output and a negative (−) output. The positive (+) output of the fully differential signal processing circuitry provides the positive (+) output terminal of the fully differential adjustable gain device. The negative (−) output of the fully differential signal processing circuitry provides the negative (−) output terminal of the fully differential adjustable gain device. The first cross-coupled segment is coupled between the differential input terminals of the fully differential adjustable gain device and the negative (−) input of the fully differential signal processing circuitry. The second cross-coupled segment is coupled between the differential input terminals of the fully differential adjustable gain device and the positive (+) input of the fully differential signal processing circuitry. The fully differential adjustable gain device has a gain that is adjustable by adjusting one or more component values of the first and second cross-coupled segments, while maintaining a substantially consistent frequency response and a substantially consistent input impedance of the fully differential adjustable gain device, so long as a specified relationship between the component values of the first and second cross-coupled segments is kept substantially constant.

Optionally, in any of the preceding aspects, the first cross-coupled segment includes a first passive component having a first adjustable component value and a second passive component having a second adjustable component value, the first passive component coupled between the negative (−) input terminal of the fully differential adjustable gain device and the negative (−) input of the fully differential signal processing circuitry, and the second passive component coupled between the positive (+) input terminal of the fully differential adjustable gain device and the negative (−) input of the fully differential signal processing circuitry. The second cross-coupled segment includes a third passive component having the first adjustable component value and a fourth passive component having the second adjustable component value, the third passive component coupled between the positive (+) input terminal of the fully differential adjustable gain device and the positive (+) input of the fully differential signal processing circuitry, and the fourth passive component coupled between the negative (−) input terminal of the fully differential adjustable gain device and the positive (+) input of the fully differential signal processing circuitry.

Optionally, in any of the preceding aspects, the first passive component of the first cross-coupled segment is a first impedance component having a first adjustable impedance value ($Z1a$), the second passive component of the first cross-coupled segment is a second impedance component having a second adjustable impedance value ($Z1b$), the third passive component of the second cross-coupled segment is a third impedance component having the first adjustable impedance value ($Z1a$), and the fourth passive component of the second cross-coupled segment is a fourth impedance component having the second adjustable impedance value ($Z1b$). The gain of the fully differential adjustable gain device is adjustable by adjusting the first adjustable impedance value ($Z1a$) of each of the first impedance component of the first cross-coupled segment and the third impedance component of the second cross-coupled segment, and adjusting the second adjustable impedance value ($Z1b$) of each of the second impedance component of the first cross-coupled segment and the fourth impedance component of the second cross-coupled segment. The specified relationship between the component values of the first and second cross-coupled segments that is kept substantially constant comprises:

$$\frac{Z1a(s) * Z1b(s)}{Z1a(s) + Z1b(s)}$$

for each value of s, wherein s is a variable that represents complex frequency.

Optionally, in any of the preceding aspects, the first impedance component is a first resistor component having a first adjustable resistance value ($R1a$), and thus, the first adjustable impedance value ($Z1a$) of the first impedance component is equal to $R1a$; the second impedance component is a second resistor component having a second adjustable resistance value ($R1b$), and thus, the second adjustable impedance value ($Z1b$) of the second impedance component is equal to R1$b$; the third impedance component is a third resistor component having the first adjustable resistance value (R1$a$), and thus, the first adjustable impedance value (Z1$a$) of the third impedance component is equal to R1$a$; and the fourth impedance component is a fourth resistor component having the second adjustable resistance value (R1$b$), and thus, the second adjustable impedance value (Z1$b$) of the fourth impedance component is equal to R1$b$. The gain of the fully differential adjustable gain device is adjustable by adjusting the first adjustable resistance value (R1$a$) of each of the first resistor component of the first cross-coupled segment and the third resistor component of the second cross-coupled segment, and adjusting the second adjustable resistance value (R1$b$) of each of the second resistor component of the first cross-coupled segment and the fourth resistor component of the second cross-coupled segment. The specified relationship between the component values of the first and second cross-coupled segments that is kept substantially constant comprises:

$$\frac{R1a * R1b}{R1a + R1b}.$$

Optionally, in any of the preceding aspects, the first impedance component is a first capacitor component having a first adjustable capacitance value (C1$a$), and thus, the first adjustable impedance value (Z1$a$) of the first impedance component is equal to 1/(s*C1$a$); the second impedance component is a second capacitor component having a second adjustable capacitance value (C1$b$), and thus, the second adjustable impedance value (Z1$b$) of the second impedance component is equal to 1/(s*C1$b$); the third impedance component is a third capacitor component having the first adjustable capacitance value (C1$a$), and thus, the first adjustable impedance value (Z1$a$) of the third impedance component is equal to 1/(s*C1$a$); and the fourth impedance component is a fourth capacitor component having the second adjustable capacitance value (C1$b$), and thus, the second adjustable impedance value (Z1$b$) of the fourth impedance component is equal to 1/(s*C1$b$). The gain of the fully differential adjustable gain device is adjustable by adjusting the first adjustable capacitor value (C1$a$) of each of the first capacitance component of the first cross-coupled segment and the third capacitor component of the second cross-coupled segment, and adjusting the second adjustable capacitance value (C1$b$) of each of the second capacitor component of the first cross-coupled segment and the fourth capacitor component of the second cross-coupled segment. The specified relationship between the component values of the first and second cross-coupled segments that is kept substantially constant comprises:

C1$a$+C1$b$.

Optionally, in any of the preceding aspects, the first impedance component is a first inductor component having a first adjustable inductance value (L1$a$), and thus, the first adjustable impedance value (Z1$a$) of the first impedance component is equal to (s*L1$a$); the second impedance component is a second inductor component having a second adjustable inductance value (L1$b$), and thus, the second adjustable impedance value (Z1$b$) of the second impedance component is equal to (s*L1$b$); the third impedance component is a third inductor component having the first adjustable inductance value (L1$a$), and thus, the first adjustable impedance value (Z1$a$) of the third impedance component is equal to (s*L1$a$); and the fourth impedance component is a fourth inductor component having the second adjustable inductance value (L1$b$), and thus, the second adjustable impedance value (Z1$b$) of the fourth impedance component is equal to (s*L1$b$). The gain of the fully differential adjustable gain device is adjustable by adjusting the first adjustable inductor value (L1$a$) of each of the first inductor component of the first cross-coupled segment and the third inductor component of the second cross-coupled segment, and adjusting the second adjustable inductance value (L1$b$) of each of the second inductor component of the first cross-coupled segment and the fourth inductor component of the second cross-coupled segment. The specified relationship between the component values of the first and second cross-coupled segments that is kept substantially constant comprises:

$$\frac{(L1a * L1b)}{L1a + L1b}.$$

Optionally, in any of the preceding aspects, the fully differential adjustable gain device comprises a fully differential filter. Optionally, in any of the preceding aspects, the fully differential filter comprises a multi-feedback (MFB) fully differential filter, wherein the fully differential signal processing circuitry thereof includes a fully differential operational-amplifier (Op-Amp), a pair of feedback resistor components, and a pair of feedback capacitor components.

Optionally, in any of the preceding aspects, the fully differential adjustable gain device comprises a fully differential variable gain amplifier (VGA), wherein the fully differential signal processing circuitry thereof includes a fully differential operational-amplifier (Op-Amp), a pair of feedback resistor components and a pair of feedback capacitor components.

Optionally, in any of the preceding aspects, the fully differential adjustable gain device comprises a fully differential continuous-time input sigma-delta analog-to-digital converter (ADC), or a fully differential mixer configured to perform at least one of frequency down-conversion or frequency up-conversion.

According to one other aspect of the present disclosure, a method is for use with a fully differential adjustable gain device, wherein the fully differential adjustable gain device includes: differential input terminals of the fully differential adjustable gain device including a negative (−) input terminal and a positive (+) input terminal; differential output terminals of the fully differential adjustable gain device including a positive (+) output terminal and a negative (−) output terminal; fully differential signal processing circuitry including differential inputs and differential outputs, the differential inputs including a negative (−) input and a positive (+) input, the differential outputs including a positive (+) output and a negative (−) output; the positive (+) output of the fully differential signal processing circuitry providing the positive (+) output terminal of the fully differential adjustable gain device; and the negative (−) output of the fully differential signal processing circuitry providing the negative (−) output terminal of the fully differential adjustable gain device. The method comprises coupling a first cross-coupled segment between the differential input terminals of the fully differential adjustable gain device and the negative (−) input of the fully differential signal processing circuitry, and coupling a second cross-coupled segment between the differential input terminals of the fully differential adjustable gain device and the positive (+) input of the fully differential signal processing circuitry. The method also includes adjusting a gain of the fully differential adjustable gain device, while maintaining a substantially consistent frequency response and a substantially consistent input impedance of the fully differential adjustable gain device, by adjusting one or more component values of the first and second cross-coupled segments while keeping substantially constant a specified relationship between the component values of the first and second cross-coupled segments.

Optionally, in any of the preceding aspects, the first cross-coupled segment includes a first passive component having a first adjustable component value and a second passive component having a second adjustable component value, the first passive component coupled between the negative (−) input terminal of the fully differential adjustable gain device and the negative (−) input of the fully differential signal processing circuitry, and the second passive component coupled between the positive (+) input terminal of the fully differential adjustable gain device and the negative (−) input of the fully differential signal processing circuitry. The second cross-coupled segment includes a third passive component having the first adjustable component value and a fourth passive component having the second adjustable component value, the third passive component coupled between the positive (+) input terminal of the fully differential adjustable gain device and the positive (+) input of the fully differential signal processing circuitry, and the fourth passive component coupled between the negative (−) input terminal of the fully differential adjustable gain device and the positive (+) input of the fully differential signal processing circuitry. The adjusting the gain of the fully differential adjustable gain device, while maintaining a substantially consistent frequency response and a substantially consistent input impedance of the fully differential adjustable gain device, comprises adjusting the first adjustable component value of each of the first passive component of the first cross-coupled segment and the third passive component of the second cross-coupled segment, and adjusting the second adjustable component value of each of the second passive component of the first cross-coupled segment and the fourth passive component of the second cross-coupled segment.

Optionally, in any of the preceding aspects: the first passive component of the first cross-coupled segment is a first impedance component having a first adjustable impedance value ($Z1a$); the second passive component of the first cross-coupled segment is a second impedance component having a second adjustable impedance value ($Z1b$); the third passive component of the second cross-coupled segment is a third impedance component having the first adjustable impedance value ($Z1a$); and the fourth passive component of the second cross-coupled segment is a fourth impedance component having the second adjustable impedance value ($Z1b$). The gain of the fully differential adjustable gain device is adjustable by adjusting the first adjustable impedance value ($Z1a$) of each of the first impedance component of the first cross-coupled segment and the third impedance component of the second cross-coupled segment, and adjusting the second adjustable impedance value ($Z1b$) of each of the second impedance component of the first cross-coupled segment and the fourth impedance component of the second cross-coupled segment. The specified relationship between the component values of the first and second cross-coupled segments that is kept substantially constant comprises:

$$\frac{Z1a(s) * Z1b(s)}{Z1a(s) + Z1b(s)}$$

for each value of s, wherein s is a variable that represents complex frequency.

Optionally, in any of the preceding aspects, the fully differential adjustable gain device, for which the method is used to adjust the gain, is selected from the group consisting of: a fully differential low pass filter (LPF); a fully differential bandpass filter (BPF); a fully differential high pass filter (HPF); or a fully differential variable gain amplifier (VGA).

Optionally, in any of the preceding aspects, the fully differential adjustable gain device, for which the method is used to adjust the gain, comprises a fully differential continuous-time input sigma-delta analog-to-digital converter (ADC) or a fully differential mixer.

According to still one other aspect of the present disclosure, there is provided a receiver, comprising a low noise amplifier (LNA), a mixer, and a fully differential adjustable gain device. The LNA is configured to amplify a radio frequency (RF) signal. The mixer is downstream of the LNA and configured to frequency down-convert the RF signal following amplification thereof by the LNA. The fully differential adjustable gain device is downstream of the mixer and configured to at least one of filter and amplify the RF signal following the frequency down-conversion thereof by the mixer. The fully differential adjustable gain device includes: differential input terminals of the fully differential adjustable gain device including a negative (−) input terminal and a positive (+) input terminal; differential output terminals of the fully differential adjustable gain device including a positive (+) output terminal and a negative (−) output terminal; and fully differential signal processing circuitry including differential inputs and differential outputs, the differential inputs including a negative (−) input and a positive (+) input, the differential outputs including a positive (+) output and a negative (−) output. The positive (+) output of the fully differential signal processing circuitry provides the positive (+) output terminal of the fully differential adjustable gain device. The negative (−) output of the fully differential signal processing circuitry provides the negative (−) output terminal of the fully differential adjustable gain device. The fully differential adjustable gain device also includes: a first cross-coupled segment coupled between the differential input terminals of the fully differential adjustable gain device and the negative (−) input of the fully differential signal processing circuitry; and a second cross-coupled segment coupled between the differential input terminals of the fully differential adjustable gain device and the positive (+) input of the fully differential signal processing circuitry. The fully differential adjustable gain device has a gain that is adjustable by adjusting one or more component values of the first and second cross-coupled segments, while maintaining a substantially consistent frequency response and a substantially consistent input impedance of the fully differential adjustable gain device, so long as a specified relationship between the component values of the first and second cross-coupled segments is kept substantially constant.

Optionally, in any of the preceding aspects, the first cross-coupled segment of the fully differential adjustable gain device includes a first passive component having a first adjustable component value and a second passive component having a second adjustable component value, the first passive component coupled between the negative (−) input terminal of the fully differential adjustable gain device and the negative (−) input of the fully differential signal processing circuitry, and the second passive component coupled between the positive (+) input terminal of the fully differential adjustable gain device and the negative (−) input of the fully differential signal processing circuitry. The second cross-coupled segment of the fully differential adjustable gain device includes a third passive component having the first adjustable component value and a fourth passive component having the second adjustable component value, the third passive component coupled between the positive (+) input terminal of the fully differential adjustable gain device and the positive (+) input of the fully differential signal processing circuitry, and the fourth passive component coupled between the negative (−) input terminal of the fully differential adjustable gain device and the positive (+) input of the fully differential signal processing circuitry.

Optionally, in any of the preceding aspects: the first passive component of the first cross-coupled segment of the fully differential adjustable gain device is a first impedance component having a first adjustable impedance value (Z1a); the second passive component of the first cross-coupled segment of the fully differential adjustable gain device is a second impedance component having a second adjustable impedance value (Z1b); the third passive component of the second cross-coupled segment of the fully differential adjustable gain device is a third impedance component having the first adjustable impedance value (Z1a); and the fourth passive component of the second cross-coupled segment of the fully differential adjustable gain device is a fourth impedance component having the second adjustable impedance value (Z1b). The gain of the fully differential adjustable gain device is adjustable by adjusting the first adjustable impedance value (Z1a) of each of the first impedance component of the first cross-coupled segment and the third impedance component of the second cross-coupled segment, and adjusting the second adjustable impedance value (Z1b) of each of the second impedance component of the first cross-coupled segment and the fourth impedance component of the second cross-coupled segment. The specified relationship between the component values of the first and second cross-coupled segments that is kept substantially constant comprises:

$$\frac{Z1a(s)*Z1b(s)}{Z1a(s)+Z1b(s)}$$

for each value of s, wherein s is a variable that represents complex frequency.

Optionally, in any of the preceding aspects, the fully differential adjustable gain device, which is downstream of the mixer and is configured to at least one of filter and amplify the RF signal following the frequency down-conversion thereof by the mixer, is selected from the group consisting of: a fully differential low pass filter (LPF); a fully differential bandpass filter (BPF); a fully differential high pass filter (HPF); or a fully differential variable gain amplifier (VGA).

Optionally, in any of the preceding aspects, the receiver is included in user equipment or a base station that is configured to communicate data within a wireless network.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the Background.

BRIEF DESCRIPTION OF THE DRAWINGS

Aspects of the present disclosure are illustrated by way of example and are not limited by the accompanying figures for which like references indicate like elements.

DETAILED DESCRIPTION

Figure 1:
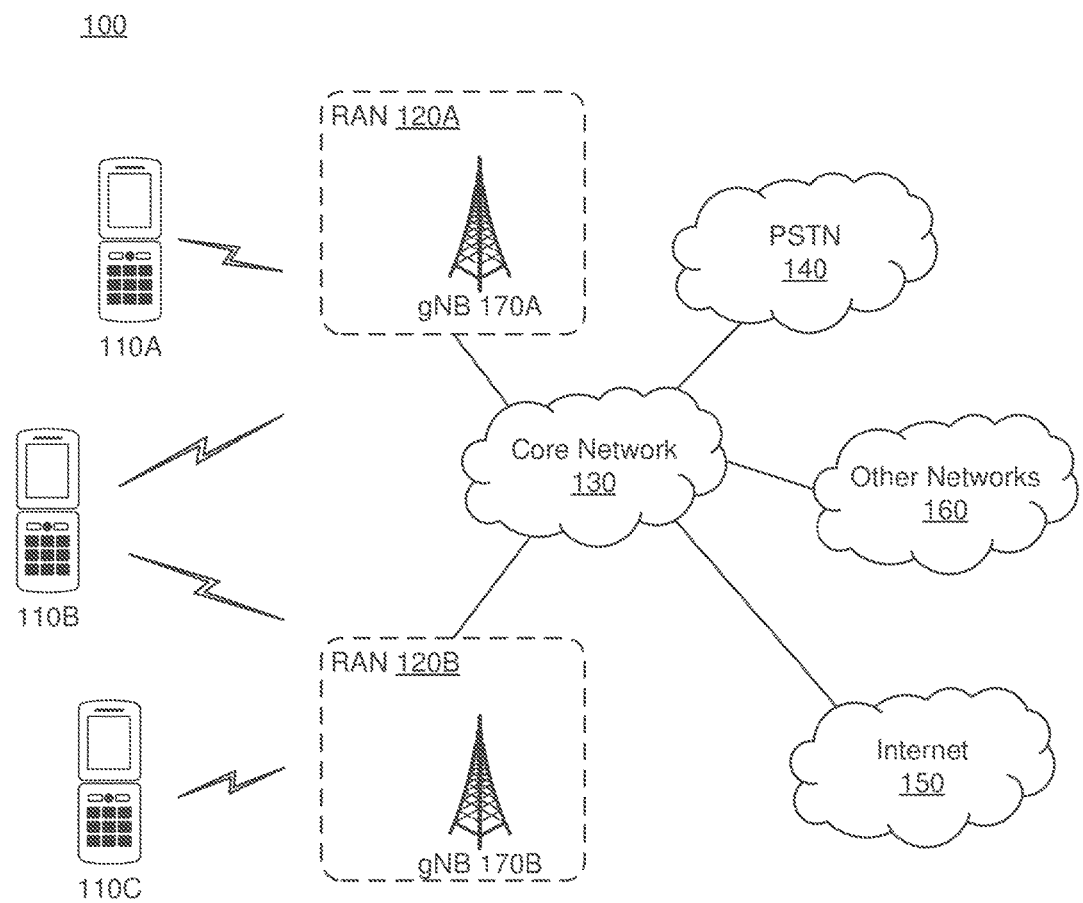
FIG. 1 illustrates an exemplary wireless network for communicating data.

The present disclosure will now be described with reference to the figures, which in general relate to fully differential adjustable gain devices, and methods for use therewith. The present disclosure also relates to receivers that include such fully differential adjustable gain devices, wherein the receivers can be used within wireless networks, an example of which is described below with reference to FIG. 1. A fully differential adjustable gain device can be, e.g., a fully differential filter, a fully differential variable gain amplifier (VGA), a fully differential continuous-time input sigma-delta analog-to-digital converter (ADC), or a fully differential mixer, but is not limited thereto. The term "device" as used herein can refer to a chip, a sub-circuit of a larger circuit included in a chip, a sub-circuit of a larger circuit included on a printed circuit board (PCB), or more generally, can be used to refer to a circuit.

In accordance with certain embodiments of the present technology, a fully differential adjustable gain device described herein includes differential input terminals, differential output terminals, fully differential signal processing circuitry, and first and second cross-coupled segments. The differential input terminals of the fully differential adjustable gain device include a negative (−) input terminal and a positive (+) input terminal. The differential output terminals of the fully differential adjustable gain device include a positive (+) output terminal and a negative (−) output terminal. The fully differential signal processing circuitry includes differential inputs and differential outputs, with the differential inputs including a negative (−) input and a positive (+) input, and the differential outputs including a positive (+) output and a negative (−) output. The positive (+) output of the fully differential signal processing circuitry provides the positive (+) output terminal of the fully differential adjustable gain device. The negative (−) output of the fully differential signal processing circuitry provides the negative (−) output terminal of the fully differential adjustable gain device. The first cross-coupled segment is coupled between the differential input terminals of the fully differential adjustable gain device and the negative (−) input of the fully differential signal processing circuitry. The second cross-coupled segment is coupled between the differential input terminals of the fully differential adjustable gain device and the positive (+) input of the fully differential signal processing circuitry. The fully differential adjustable gain device has a gain that is adjustable by adjusting one or more component values of the first and second cross-coupled segments, while maintaining a substantially consistent frequency response and a substantially consistent input impedance of the fully differential adjustable gain device, so long as a specified relationship between the component values of the first and second cross-coupled segments is kept substantially constant. As will be described in additional detail below, the fully differential signal processing circuitry (of the fully differential adjustable gain device) can include a fully differential operational-amplifier (Op-Amp), a pair of feedback resistor components, and a pair of feedback capacitor components, which can be arranged such that the fully differential adjustable gain device operates as a low pass filter (LPF), a bandpass filter (BPF), a high pass filter (HPF), or a variable gain amplifier (VGA), but is not limited thereto.

It is understood that the present embodiments of the disclosure may be implemented in many different forms and that claims scopes should not be construed as being limited to the embodiments set forth herein. Rather, these embodiments are provided so that this disclosure will be thorough and complete and will fully convey the inventive embodiment concepts to those skilled in the art. Indeed, the disclosure is intended to cover alternatives, modifications and equivalents of these embodiments, which are included within the scope and spirit of the disclosure as defined by the appended claims. Furthermore, in the following detailed description of the present embodiments of the disclosure, numerous specific details are set forth in order to provide a thorough understanding. However, it will be clear to those of ordinary skill in the art that the present embodiments of the disclosure may be practiced without such specific details.

Figure 2:
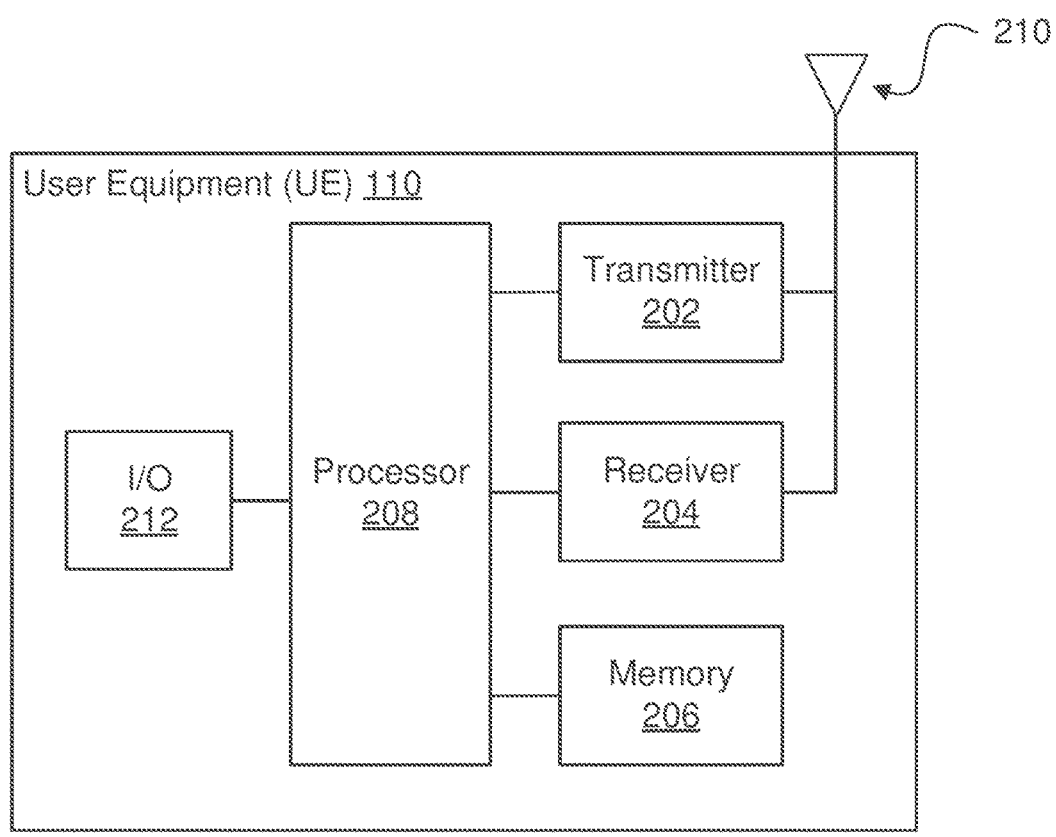
FIG. 2 illustrates exemplary details of an instance of user equipment (UE) introduced in FIG. 1.
Figure 3:
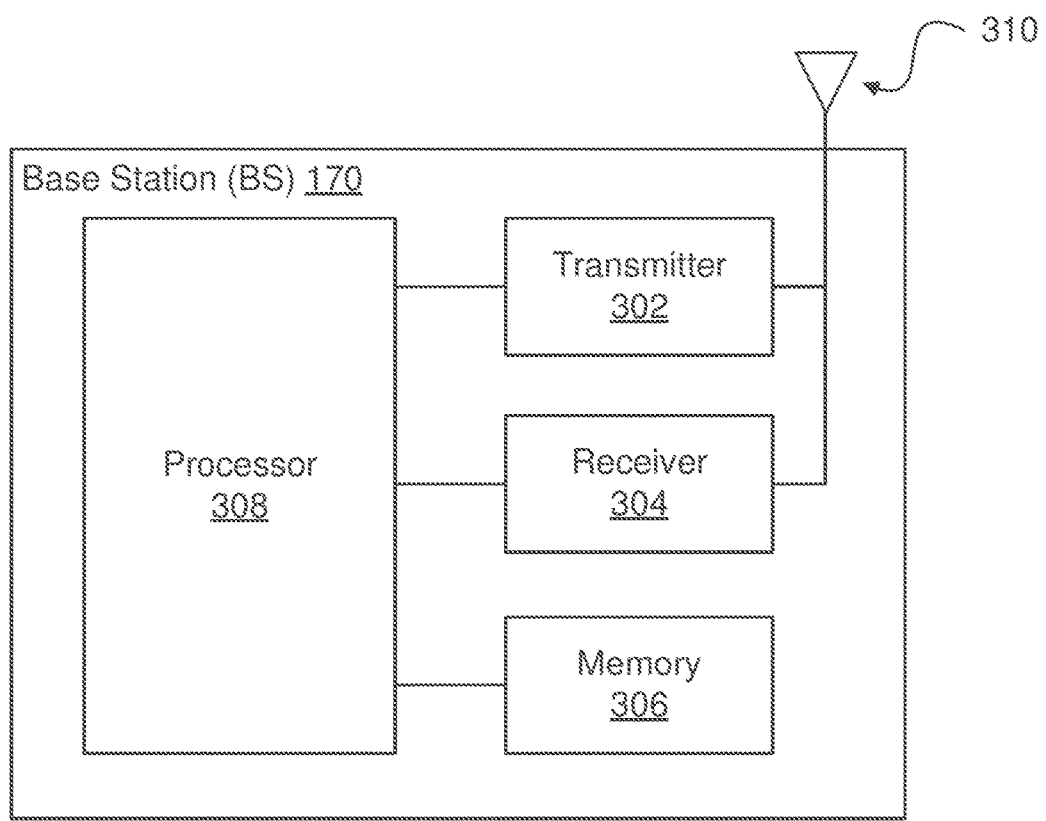
FIG. 3 illustrates exemplary details of an instance of a base station (BS) introduced in FIG. 1.
Figure 4:
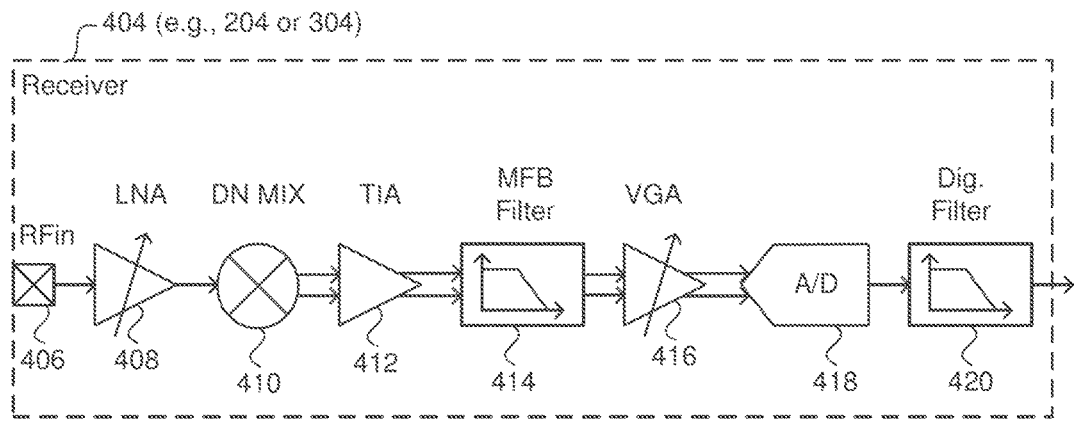
FIG. 4 illustrates exemplary details of a receiver included in UE or a BS shown in FIGS. 2 and 3.

Before provided additional details of fully differential adjustable gain devices of embodiments of the present technology, FIG. 1 is used to describe an exemplary wireless network for communicating data, FIG. 2 is used to describe exemplary details of an instance of user equipment (UE) introduced in FIG. 1, and FIG. 3 is used to describe exemplary details of an instance of a base station (BS) introduced in FIG. 1. Additionally, FIG. 4 is used to describe exemplary details of a receiver included UE or a BS. The fully differential adjustable gain circuits described herein can be included within a receiver, such as the receiver described with reference to FIG. 4, but is not limited thereto.

Referring to FIG. 1, illustrated therein is an exemplary wireless network for communicating data. The communication system 100 includes, for example, user equipment 110A, 110B, and 110C, radio access networks (RANs) 120A and 120B, a core network 130, a public switched telephone network (PSTN) 140, the Internet 150, and other networks 160. Additional or alternative networks include private and public data-packet networks including corporate intranets. While certain numbers of these components or elements are shown in the figure, any number of these components or elements may be included in the system 100.

In one embodiment, the wireless network may be a fifth generation (5G) network including at least one 5G base station which employs orthogonal frequency-division multiplexing (OFDM) and/or non-OFDM and a transmission time interval (TTI) shorter than 1 milliseconds (e.g. 100 or 200 microseconds), to communicate with the communication devices. In general, a base station may also be used to refer any of the eNB and the 5G BS (gNB). In addition, the network may further include a network server for processing information received from the communication devices via the at least one eNB or gNB.

System 100 enables multiple wireless users to transmit and receive data and other content. The system 100 may implement one or more channel access methods, such as but not limited to code division multiple access (CDMA), time division multiple access (TDMA), frequency division multiple access (FDMA), orthogonal FDMA (OFDMA), or single-carrier FDMA (SC-FDMA).

The user equipment (UE) 110A, 110B, and 110C, which can be referred to individually as an UE 110, or collectively as the UEs 110, are configured to operate and/or communicate in the system 100. For example, an UE 110 can be configured to transmit and/or receive wireless signals or wired signals. Each UE 110 represents any suitable end user device and may include such devices (or may be referred to) as a user equipment/device, wireless transmit/receive unit (UE), mobile station, fixed or mobile subscriber unit, pager, cellular telephone, personal digital assistant (PDA), smartphone, laptop, computer, touchpad, wireless sensor, wearable devices or consumer electronics device.

In the depicted embodiment, the RANs 120A, 120B include one or more base stations (BSs) 170A, 170B, respectively. The RANs 120A and 120B can be referred to individually as a RAN 120, or collectively as the RANs 120. Similarly, the base stations (BSs) 170A and 170B can be referred to individually as a base station (BS) 170, or collectively as the base stations (BSs) 170. Each of the BSs 170 is configured to wirelessly interface with one or more of the UEs 110 to enable access to the core network 130, the PSTN 140, the Internet 150, and/or the other networks 160. For example, the base stations (BSs) 170 may include one or more of several well-known devices, such as a base transceiver station (BTS), a Node-B (NodeB), an evolved NodeB (eNB), a next (fifth) generation (5G) NodeB (gNB), a Home NodeB, a Home eNodeB, a site controller, an access point (AP), or a wireless router, or a server, router, switch, or other processing entity with a wired or wireless network.

In one embodiment, the BS 170A forms part of the RAN 120A, which may include one or more other BSs 170, elements, and/or devices. Similarly, the BS 170B forms part of the RAN 120B, which may include one or more other BSs 170, elements, and/or devices. Each of the BSs 170 operates to transmit and/or receive wireless signals within a particular geographic region or area, sometimes referred to as a "cell." In some embodiments, multiple-input multiple-output (MIMO) technology may be employed having multiple transceivers for each cell.

The BSs 170 communicate with one or more of the UEs 110 over one or more air interfaces (not shown) using wireless communication links. The air interfaces may utilize any suitable radio access technology.

It is contemplated that the system 100 may use multiple channel access functionality, including for example schemes in which the BSs 170 and UEs 110 are configured to implement the Long Term Evolution wireless communication standard (LTE), LTE Advanced (LTE-A), and/or LTE Multimedia Broadcast Multicast Service (MBMS). In other embodiments, the base stations 170 and user equipment 110A-110C are configured to implement UMTS, HSPA, or HSPA+ standards and protocols. Of course, other multiple access schemes and wireless protocols may be utilized.

The RANs 120 are in communication with the core network 130 to provide the UEs 110 with voice, data, application, Voice over Internet Protocol (VoIP), or other services. As appreciated, the RANs 120 and/or the core network 130 may be in direct or indirect communication with one or more other RANs (not shown). The core network 130 may also serve as a gateway access for other networks (such as PSTN 140, Internet 150, and other networks 160). In addition, some or all of the UEs 110 may include functionality for communicating with different wireless networks over different wireless links using different wireless technologies and/or protocols.

The RANs 120 may also include millimeter and/or microwave access points (APs). The APs may be part of the BSs 170 or may be located remote from the BSs 170. The APs may include, but are not limited to, a connection point (an mmW CP) or a BS 170 capable of mmW communication (e.g., a mmW base station). The mmW APs may transmit and receive signals in a frequency range, for example, from 24 GHz to 100 GHz, but are not required to operate throughout this range. As used herein, the term base station is used to refer to a base station and/or a wireless access point.

Although FIG. 1 illustrates one example of a communication system, various changes may be made to FIG. 1. For example, the communication system 100 could include any number of user equipment, base stations, networks, or other components in any suitable configuration. It is also appreciated that the term user equipment may refer to any type of wireless device communicating with a radio network node in a cellular or mobile communication system. Non-limiting examples of user equipment are a target device, device-to-device (D2D) user equipment, machine type user equipment or user equipment capable of machine-to-machine (M2M) communication, laptops, PDA, iPad, Tablet, mobile terminals, smart phones, laptop embedded equipped (LEE), laptop mounted equipment (LME) and USB dongles.

FIG. 2 illustrates example details of an UE 110 that may implement the methods and teachings according to this disclosure. The UE 110 may for example be a mobile telephone, but may be other devices in further examples such as a desktop computer, laptop computer, tablet, handheld computing device, automobile computing device and/or other computing devices. As shown in the figure, the exemplary UE 110 is shown as including at least one transmitter 202, at least one receiver 204, memory 206, at least one processor 208, and at least one input/output device 212. The processor 208 can implement various processing operations of the UE 110. For example, the processor 208 can perform signal coding, data processing, power control, input/output processing, or any other functionality enabling the UE 110 to operate in the system 100 (FIG. 1). The processor 208 may include any suitable processing or computing device configured to perform one or more operations. For example, the processor 208 may include a microprocessor, microcontroller, digital signal processor, field programmable gate array, or application specific integrated circuit.

The transmitter 202 can be configured to modulate data or other content for transmission by at least one antenna 210. The transmitter 202 can also be configured to amplify, filter and frequency convert RF signals before such signals are provided to the antenna 210 for transmission. The transmitter 202 can include any suitable structure for generating signals for wireless transmission.

The receiver 204 can be configured to demodulate data or other content received by the at least one antenna 210. The receiver 204 can also be configured to amplify, filter and frequency convert RF signals received via the antenna 210. The receiver 204 can include any suitable structure for processing signals received wirelessly. The antenna 210 can include any suitable structure for transmitting and/or receiving wireless signals. The same antenna 210 can be used for both transmitting and receiving RF signals, or alternatively, different antennas 210 can be used for transmitting signals and receiving signals.

It is appreciated that one or multiple transmitters 202 could be used in the UE 110, one or multiple receivers 204 could be used in the UE 110, and one or multiple antennas 210 could be used in the UE 110. Although shown as separate blocks or components, at least one transmitter 202 and at least one receiver 204 could be combined into a transceiver. Accordingly, rather than showing a separate block for the transmitter 202 and a separate block for the receiver 204 in FIG. 2, a single block for a transceiver could have been shown.

The UE 110 further includes one or more input/output devices 212. The input/output devices 212 facilitate interaction with a user. Each input/output device 212 includes any suitable structure for providing information to or receiving information from a user, such as a speaker, microphone, keypad, keyboard, display, or touch screen.

In addition, the UE 110 includes at least one memory 206. The memory 206 stores instructions and data used, generated, or collected by the UE 110. For example, the memory 206 could store software or firmware instructions executed by the processor(s) 204 and data used to reduce or eliminate interference in incoming signals. Each memory 206 includes any suitable volatile and/or non-volatile storage and retrieval device(s). Any suitable type of memory may be used, such as random access memory (RAM), read only memory (ROM), hard disk, optical disc, subscriber identity module (SIM) card, memory stick, secure digital (SD) memory card, and the like.

FIG. 3 illustrates an example BS 170 that may implement the methods and teachings according to this disclosure. As shown in the figure, the BS 170 includes at least one processor 308, at least one transmitter 302, at least one receiver 304, one or more antennas 310, and at least one memory 306. The processor 308 implements various processing operations of the BS 170, such as signal coding, data processing, power control, input/output processing, or any other functionality. Each processor 308 includes any suitable processing or computing device configured to perform one or more operations. Each processor 308 could, for example, include a microprocessor, microcontroller, digital signal processor, field programmable gate array, or application specific integrated circuit.

Each transmitter 302 includes any suitable structure for generating signals for wireless transmission to one or more UEs 110 or other devices. Each receiver 304 includes any suitable structure for processing signals received wirelessly from one or more UEs 110 or other devices. Although shown as separate blocks or components, at least one transmitter 302 and at least one receiver 304 could be combined into a transceiver. Each antenna 310 includes any suitable structure for transmitting and/or receiving wireless signals. While a common antenna 310 is shown here as being coupled to both the transmitter 302 and the receiver 304, one or more antennas 310 could be coupled to the transmitter(s) 302, and one or more separate antennas 310 could be coupled to the receiver(s) 304. Each memory 306 includes any suitable volatile and/or non-volatile storage and retrieval device(s).

Certain embodiments of the present technology described herein can be implemented using hardware, software, or a combination of both hardware and software. The software used is stored on one or more of the processor readable storage devices described above to program one or more of the processors to perform the functions described herein. The processor readable storage devices can include computer readable media such as volatile and non-volatile media, removable and non-removable media. By way of example, and not limitation, computer readable media may comprise computer readable storage media and communication media. Computer readable storage media may be implemented in any method or technology for storage of information such as computer readable instructions, data structures, program modules or other data. Examples of computer readable storage media include RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by a computer. A computer readable medium or media does (do) not include propagated, modulated or transitory signals.

Communication media typically embodies computer readable instructions, data structures, program modules or other data in a propagated, modulated or transitory data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as RF and other wireless media. Combinations of any of the above are also included within the scope of computer readable media.

In alternative embodiments, some or all of the software can be replaced by dedicated hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), special purpose computers, etc. In one embodiment, software (stored on a storage device) implementing one or more embodiments is used to program one or more processors. The one or more processors can be in communication with one or more computer readable media/storage devices, peripherals and/or communication interfaces.

FIG. 4 illustrates exemplary details of a receiver 404, which can be the receiver 204 included in the UE 110 (shown in FIG. 2) or the receiver 304 included in the BS 170 (shown in FIG. 3), but is not limited thereto. Referring to FIG. 4, the receiver 404 is shown as including an input 406 at which is received a radio frequency (RF) signal, and thus, the input 406 can also be referred to as the RF input 406. The RF input 406 can be coupled to an antenna or a coupler, but is not limited thereto. The RF signal received by the RF input 406 is provided to a low noise amplifier (LNA) 408, which may have an adjustable gain. The LNA 408 amplifies the relatively low-power RF signal it receives without significantly degrading the signal's signal-to-noise ratio (SNR). The amplified RF signal that is output by the LNA 408 is provided to a mixer 410. The mixer 410, in addition to receiving the amplified RF signal from the LNA 408, also receives an oscillator signal (e.g., from a local oscillator, not shown), and adjusts the frequency of the amplifier RF signal, e.g., from first frequency to a second frequency that is lower than the first frequency. More specifically, the mixer 410 can be a down-mixer (DN MIX) that frequency down-converts the amplified RF signal from a relatively high frequency to a baseband frequency, or an intermediate frequency (IF) that is offset from the baseband frequency.

Still referring to FIG. 4, the frequency down-converted RF signal that is output from the mixer 410 is shown as being provided to a trans-impedance amplifier (TIA) 412. The TIA 412 acts as a current buffer to isolate a multi-feedback (MFB) filter 414 that is downstream of the TIA 412, from the mixer 410 that is upstream of the TIA 412. The MFB filter 414 low pass filters the frequency down-converted RF signal, to filter out high frequency signal components that are not of interest, such as HF noise. The filtered signal that is output from the MFB filter 414 is provided to a variable gain amplifier (VGA), which is used to amplify the signal before it is provided to an analog-to-digital converter (A/D) 418, which converts the signal from an analog signal to a digital signal. The digital signal output from the A/D 418 is then provided to a digital filter 420, which performs additional filtering to remove out of band signal components and attenuates quantization energy from the A/D 418. The filtered digital signal that is output by the digital filter 420 is then provided to further digital circuitry that is downstream from the digital filter 420. Such further digital circuitry can include, for example, a digital signal processor (DSP), but is not limited thereto. The same DSP, or a different DSP, can be used to implement the digital filter 420.

In FIG. 4, the TIA 412, the MFB filter 414, and the VGA 416 are illustrated as fully differential circuits, since they each have respective differential inputs and differential outputs. By contrast the LNA 408 is illustrated as having a single ended input and a single ended output, the mixer 410 is illustrated as having a single ended input and differential outputs, and the A/D 418 is illustrated as having differential inputs and a single ended output. However, it is noted that the LNA 408 can alternatively have a single ended input and differential outputs, or differential inputs and differential outputs. Similarly, the mixer 410 can alternatively be a fully differential mixer having differential inputs and differential outputs, and the A/D 418 can be a fully differential A/D having differential inputs and differential outputs. Other variations are also possible and within the scope of the embodiments described herein.

Figure 5:
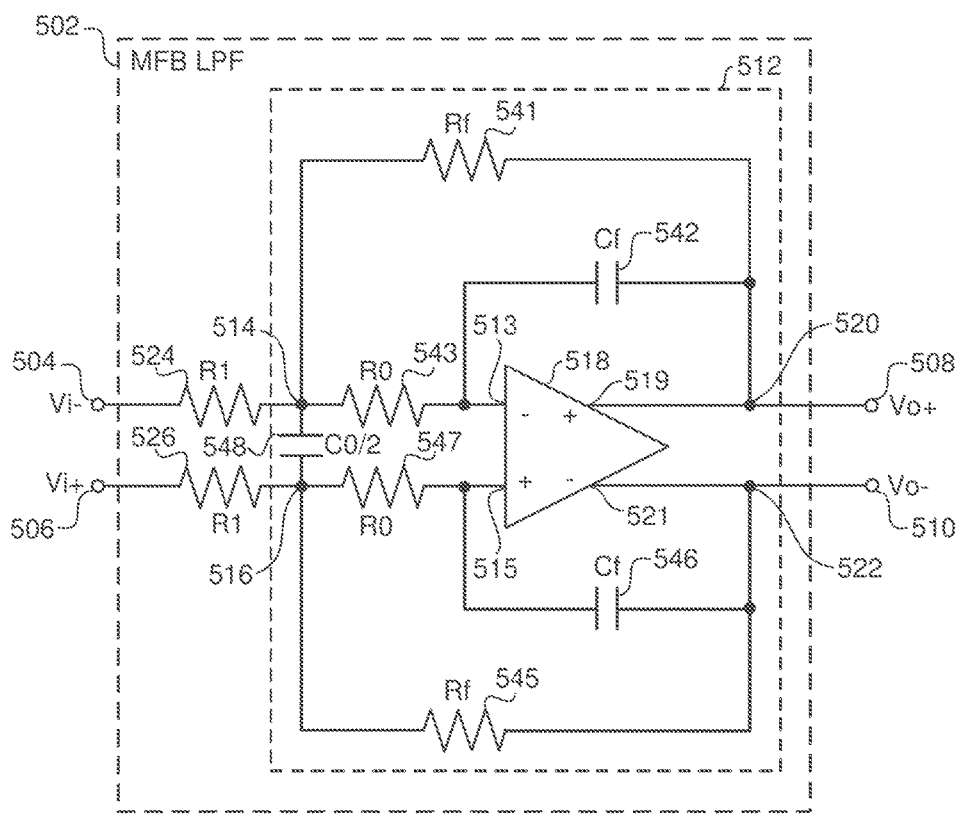
FIG. 5 illustrates a prior art fully differential multi-feedback (MFB) low pass filter (LPF) that can be included in a receiver, such as the receiver illustrated in FIG. 4.

FIG. 5 will now be used to describe a prior art fully differential multi-feedback (MFB) low pass filter (LPF) 502 that can be included in a receiver, such as the receiver 404 illustrated in FIG. 4. More specifically, the MFB LPF 502 can be used as the MFB filter 414 shown in FIG. 4. The fully differential MFB LPF 502, which can also be referred to herein more succinctly as the MFB filter 502, is shown as having differential input terminals, including a negative (−) input terminal 504 and a positive (+) input terminal 506. The MFB filter 502 is also shown as having differential output terminals, including a positive (+) output terminal 508 and a negative (−) output terminal 510. The MFB filter 502 includes a fully differential operational amplifier (op-amp) 518 including differential inputs and differential outputs, wherein the differential inputs include a negative (−) input 513 and a positive (+) input 515, and the differential outputs include a positive (+) output 519 and a negative (−) output 521. Negative inputs are also known as inverting inputs, and positive inputs are also known as non-inverting inputs. Similarly, negative outputs are also known as inverting outputs, and positive outputs are also known as non-inverting outputs. The MFB LPF filter 502 is a fully differential filter because it includes both differential inputs and differential outputs.

In the MFB filter 502, the positive (+) output 519 of the op-amp 518 is connected to the negative (−) input 513 of the op-amp 519 by a feedback capacitor component 542 having a capacitance value Cf. The negative (−) output 521 of the op-amp 518 is connected to the positive (+) input 515 of the op-amp 518 by a feedback capacitor component 546 having the same capacitance value Cf as the feedback capacitor component 542. The MFB filter 502 also includes feedback resistor components 541 and 545 that each have the same resistance value Rf. One of the terminals of the feedback resistor component 541 is connected to the positive (+) output 519 of the op-amp 518, and the other terminal of the feedback resistor 541 is connected to one of the terminals of the capacitor component 548, which has a capacitance value C0/2. One of the terminals of the feedback resistor component 545 is connected to the negative (−) output 521 of the op-amp 518, and the other terminal of the feedback resistor component 545 is connected to the other one of the terminals of the capacitor component 548. One of the terminals of a resistor component 543, having a resistance value R0, is connected to the negative (−) input 513 of the op-amp 518, and the other one of the terminals of the resistor component 543 is connected to one of the terminals of the capacitor component 548. One of the terminals of a resistor component 547, having the resistance value R0, is connected to the positive (+) input 515 of the op-amp 518, and the other one of the terminals of the resistor component 547 is connected to the other one of the terminals of the capacitor component 548. A resistor component 548, having a resistance value R1, is coupled between the negative input terminal 504 of the MFB filter 502 and one of the terminals of the capacitor component 548. A resistor component 526, having the same resistance value R1 as the resistor component 524, is coupled between the positive input terminal 506 of the MFB filter 502 and the other one of the terminals of the capacitor component 548.

Vo(s)/Vi(s) for the fully differential MFB LPF 502 is shown in the following Equation(1A):

$$\frac{Vo(s)}{Vi(s)} = Gain * \frac{\frac{-1}{C0 * Cf * R0 * Rf}}{s^2 + s * \frac{1}{C0} * \left(\frac{1}{R0} + \frac{1}{R1} + \frac{1}{Rf}\right) + \frac{1}{C0 * Cf * R0 * Rf}}$$

where,
Vi(s) is the voltage of the differential input signal,
Vo(s) is the voltage of the differential output signal,
Gain is equal to Rf/R1,
R0 is the resistance of each of the resistor components 543 and 547,
R1 is the resistance of each of the resistor components 524 and 526,
Rf is the resistance of each of the feedback resistor components 541 and 545,
Cf is the capacitance of each of the feedback capacitor components 542 and 546,
C0 is twice the capacitance of the capacitor component 548, and
s is a variable that represents complex frequency.

The MFB filter 502 can have a fixed gain, which may or may not be unity gain, or may have an adjustable gain. Where the MFB filter 502 has an adjustable gain, it is desirable for the MFB filter to have substantially the same frequency response across the different gain settings. However, in order to adjust the gain of the MFB filter 502 while maintaining the same frequency response across different gain settings, at least five of the nine passive components included in the MFB filter 502 need to be adjusted, including the feedback resistor components 541 and 545, the feedback capacitor components 542 and 546, and the capacitor component 548. However, even if these five of the nine passive components of the MFB filter 502 are adjusted to maintain substantially the same frequency response for different gain settings, the input impedance of the MFB filter 502 significantly changes from one gain setting to another, which is typically unacceptable.

In order to adjust the gain of the MFB filter 502, while maintaining substantially the same (i.e., substantially consistent) frequency response, as well as substantially the same (i.e., substantially consistent) input impedance, would require adjusting at least six of the nine passive components included in the MFB filter 502, including the feedback resistor components 541 and 545, the feedback capacitor components 542 and 546, and the resistor components 524 and 526. However, the complex circuitry required to control at least six of the nine passive components would significantly increase the die area and cost required to provide the MFB filter 502, particularly if the MFB filter 502 had several different bandwidth modes. Additionally, the fact that the relationship between the component values is not linear across the different gain settings adds to the difficulty of maintaining substantially the same frequency response, as well as substantially the same input impedance, across different gain settings.

A resistor component, as the term is used herein, can include a single circuit element, such as a single resistor, or multiple circuit elements or sub-components, such as multiple resistors connected in a resistor network, but is not limited thereto. For example, a resistor component having a resistance of 1 kilo-ohm, can be implemented using a single 1 kilo-ohm resistor, two 500 ohm resistors connected in series, or two 2 kilo-ohm resistors connected in parallel, but is not limited thereto. A capacitor component, as the term is used herein, can include a single circuit element, such as a single capacitor, or multiple circuit elements or sub-components, such as multiple capacitors connected in a capacitor network, but is not limited thereto. Similarly, an inductor component, as the term is used herein, can include a single circuit element, or multiple circuit elements or sub-components, such as one or more inductors. Resistors, capacitors, and inductors are examples of various types of passive components, each of which can also be referred to as an impedance component having an impedance value.

Referring again to FIG. 5, the circuitry within the dashed lined block labeled 512 can be referred to collectively as fully differential filter circuitry 512 having differential inputs and differential outputs, wherein the differential inputs include a negative (−) input 514 and a positive (+) input 516, and the differential outputs include a positive (+) output 520 and a negative (−) output 522. The fully differential filter circuitry 512 can be referred to more generically as fully differential signal processing circuitry. As can be appreciated from FIG. 5, the resistor components 524 and 526, which have the same resistance value R1, are connected between the differential input terminals 504, 506 of the MFB filter 502 and the differential inputs 514, 516 of the fully differential filter circuitry 512.

Figure 6:
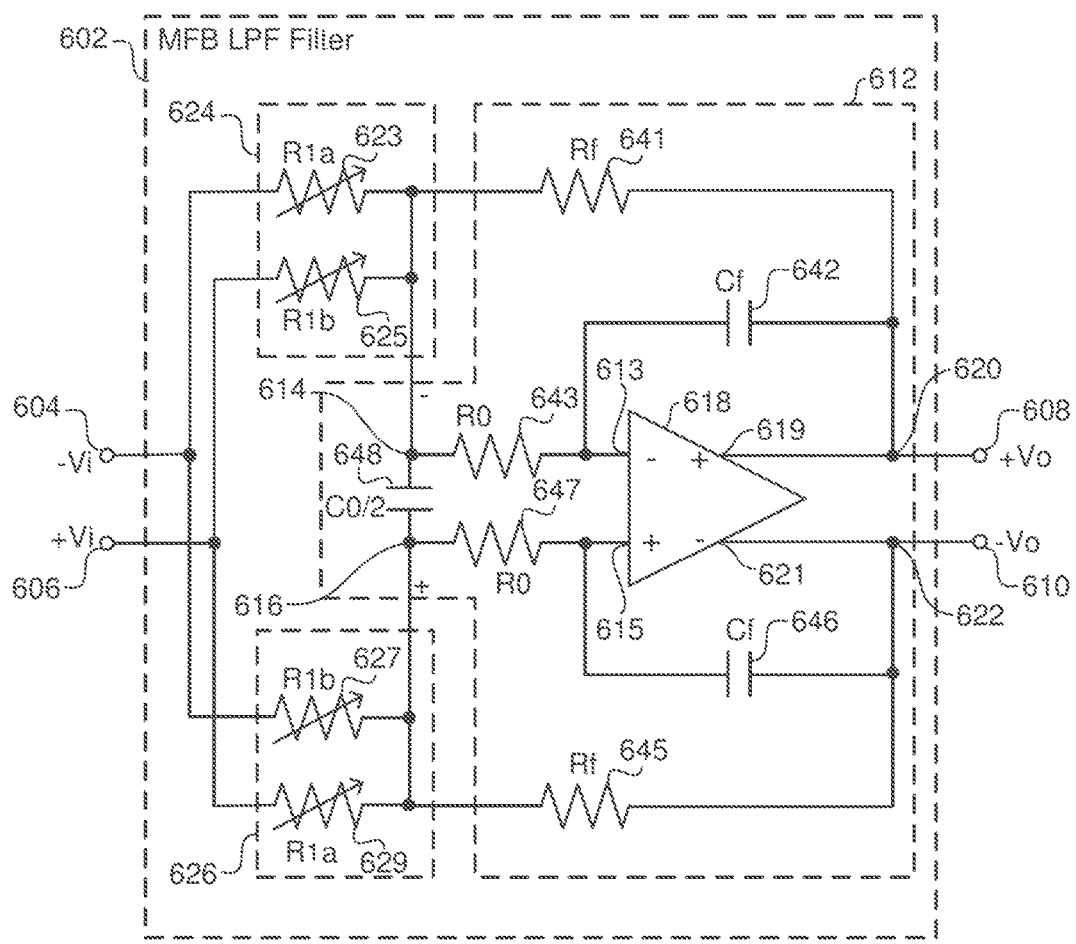
FIG. 6 illustrates a fully differential adjustable gain MFB LPF, according to an embodiment of the present technology, which fully differential adjustable gain MFB LPF filter can be included in a receiver, such as the receiver illustrated in FIG. 4, but is not limited thereto.

In accordance with certain embodiments of the present technology, initially described below with reference to FIG. 6, the resistor components 524 and 526 (in FIG. 5) are replaced with two cross-coupled segments 624 and 626 (as shown in FIG. 6). Benefits of using the cross-coupled segments 624 and 626 will be described below.

Referring to FIG. 6, shown therein is a fully differential MFB LPF 602, according to an embodiment of the present technology. The MFB LPF 602 can be included in a receiver, such as the receiver 404 illustrated in FIG. 4, e.g., as the MFB filter 414 shown in FIG. 4. The fully differential MFB LPF 602, which can also be referred to herein more succinctly as the MFB filter 602, is shown as having differential input terminals, including a negative (−) input terminal 604 and a positive (+) input terminal 606. The MFB filter 602 is also shown as having differential output terminals, including a positive (+) output terminal 608 and a negative (−) output terminal 610. The MFB filter 602 includes a fully differential op-amp 618 including differential inputs and differential outputs, wherein the differential inputs include a negative (−) input 613 and a positive (+) input 615, and the differential outputs include a positive (+) output 619 and a negative (−) output 621. The MFB filter 602 is also shown as including feedback resistor components 641 and 645, having the same resistance value Rf, which are connected in the same manner as the resistor components 541 and 545 described above with reference to FIG. 5. The MFB filter is also shown as including feedback capacitor components 642 and 646, having the same capacitance value Cf, which are connected in the same manner as the capacitor components 542 and 546 described above with reference to FIG. 5. Similarly, the resistor components 643 and 647, having the same resistance value R0, are connected in the same manner as the resistor components 543 and 547 described above with reference to FIG. 5. Further, the capacitor component 648, having the resistance value C0/2, is connected in the same manner as the capacitor component 548 described above with reference to FIG. 5. The MFB LPF filter 602 is a fully differential filter because it includes both differential inputs and differential outputs.

Still referring to FIG. 6, the circuitry within the dashed lined block labeled 612 can be referred to collectively as fully differential filter circuitry 612 having differential inputs and differential outputs, wherein the differential inputs include a negative (−) input 614 and a positive (+) input 616, and the differential outputs include a positive (+) output 620 and a negative (−) output 622. The fully differential filter circuitry 612 can be referred to more generically as fully differential signal processing circuitry. In FIG. 6, the cross-coupled segment 624 is coupled between the differential input terminals 604, 606 of the MFB filter 602 and the negative (−) input 614 of the fully differential filter circuitry 612, wherein the cross-coupled segment 624 includes a resistor component 623 having a resistance value R1a, and also includes a resistor component 625 having a resistance value R1b. The cross-coupled segment 626 is coupled between the differential input terminals 604, 606 of the MFB filter 602 and the positive (+) input 616 of the fully differential filter circuitry 612, wherein the cross-coupled segment 626 includes a resistor component 629 having the resistance value R1a (which is the same resistance as the resistor component 623), and also includes a resistor component 627 having the resistance R1b value (which is the same resistance as the resistor component 625). The resistor components 623, 625, 627 and 629 are adjustable resistor components, and thus, each can be said to have an adjustable resistance. Accordingly, the resistor components 623 and 629 can be said to have an adjustable resistance value R1a, and the resistor components 625 and 627 can be said to have an adjustable resistance value R1b.

More specifically, as can be appreciated from FIG. 6, the cross-coupled segment 624 includes the resistor component 623 having the adjustable resistance value R1a and the resistor component 625 having the adjustable resistance value R1b. The resistor component 623 is coupled between the negative (−) input terminal 604 of the MFB filter 602 and the negative (−) input 614 of the fully differential filter circuitry 612. The resistor component 625 is coupled between the positive (+) input terminal 606 of the MFB filter 602 and the negative (−) input 614 of the fully differential filter circuitry 612. As can also be appreciated from FIG. 6, the cross-coupled segment 626 includes the resistor component 629 having the adjustable resistance value R1a and the resistor component 627 having the adjustable resistance value R1b. The resistor component 629 is coupled between the positive (+) input terminal 606 of the MFB filter 602 and the positive (+) input 616 of the fully differential filter circuitry 612. The resistor component 627 is coupled between the negative (−) input terminal 604 of the MFB filter 602 and the positive (+) input 616 of the fully differential filter circuitry 612. The terms "resistance value" and "resistance" are used interchangeably herein, as are the terms "capacitance value" and "capacitance", the terms "inductance value" and "inductance", and the terms "impedance value" and "impedance".

Vo(s)/Vi(s) for the fully differential MFB LPF 602 is shown in the following Equation(1B):

$$\frac{Vo(s)}{Vi(s)} = \text{Gain} * \frac{\frac{-1}{C0 * Cf * R0 * Rf}}{s^2 + s * \frac{1}{C0} * \left(\frac{1}{R0} + \frac{1}{R1} + \frac{1}{Rf}\right) + \frac{1}{C0 * Cf * R0 * Rf}}$$

where,
Vi(s) is the voltage of the differential input signal,
Vo(s) is the voltage of the differential output signal,
Gain is equal to (Rf/R1b)−(Rf/R1a),
R0 is the resistance of each of the resistor components 643 and 647,
R1 is equal to (R1a*R1b)/(R1a+R1b),
R1a is the resistance of each of the resistor components 623 and 629,
R1b is the resistance of each of the resistor components 625 and 627,
Rf is the resistance of each of the feedback resistor components 641 and 645,
Cf is the capacitance of each of the feedback capacitor components 642 and 646,
C0 is twice the capacitance of the capacitor component 548, and
s is a variable that represents complex frequency.

Beneficially, the gain of the fully differential MFB LPF 602 can be adjusted, without substantially affecting a frequency response and without substantially affecting an input impedance of the fully differential MFB LPF 602 (i.e., while keeping the frequency response substantially consistent and the input impedance substantially consistent of the fully differential MFB LPF 602), by only adjusting the resistance R1a (which is the resistance of each of the resistor component 623 of the cross-coupled segment 624 and the resistor component 629 of the cross-coupled segment 626), and adjusting the resistance R1b (which is the resistance of each of the resistor component 625 of the cross-coupled segment 624 and the resistor component 627 of the cross-coupled segment 626). Accordingly, the other seven passive components of the MFB filter (including the feedback resistor components 641 and 645, the feedback capacitor components 642 and 646, the resistor components 643 and 647, and the capacitive component 648) need not be adjusted and can have fixed component values. The described embodiment enables the MFB filter 602 to be implemented in a relatively small die area, with relatively easy gain control. The condition that needs to be met, to keep the frequency response substantially consistent and the input impedance substantially consistent of the fully differential MFB LPF 602, is keeping substantially constant a specified relationship between component values of the cross-coupled segments 624 and 626. The input impedance and frequency response of the fully differential MFB LPF 602 is the same as the input impedance and frequency response of the fully differential MFB LPF 502 (discussed above with reference to FIG. 5), with R1 in equaling (R1a*R1b)/(R1a+R1b), which equation is referred to as Equation(2) below. More specifically, the gain of the MFB filter 602 can be adjusted, while keeping the frequency response of MFB filter 602 substantially consistent and keeping the input impedance of the MFB filter 602 substantially consistent, by adjusting a value of the adjustable resistance R1a and a value of adjustable resistance R1b, which are resistance values of resistor components included in each of the cross-coupled segments 624 and 626, while keeping substantially constant the following Equation(2):

$$\frac{R1a * R1b}{R1a + R1b}.$$

For a specific example, assume that four desired gain settings include gains of 14.00 dB, 10.00 dB, 6.00 dB and 2.00 dB. Also assume that the substantially consistent impedance that each of the cross-coupled segments 624, 626 of the MFB filter 602 is kept at is to be 400 ohms. The gain of 14.00 dB can be achieved by setting R1a equal to 490.58 ohms and setting R1b equal to 2166.32 ohms. The gain of 10.00 dB can be achieved by setting R1a equal to 572.27 ohms and setting R1b equal to 1328.28 ohms. The gain of 6.00 dB can be achieved by setting R1a equal to 639.44 ohms and setting R1b equal to 1068.22 ohms. The gain of 2.00 dB can be achieved by setting R1a equal to 690.59 ohms and setting R1b equal to 950.60 ohms. Negative gains can also be achieved if desired. For example, a gain of −2.00 dB can be achieved by setting R1a equal to 727.30 ohms and setting R1b equal to 888.85 ohms; and a gain of −4.00 dB can be achieved by setting R1a equal to 741.15 ohms and setting R1b equal to 860.00 ohms.

In the embodiment of FIG. 6, the positive (+) output 619 of the op-amp 618, the positive output 620 of the fully differential filter circuitry 612, and the positive output 608 of the MFB filter 602 are at the same node. Similarly, in the embodiment of FIG. 6, the negative (−) output 621 of the op-amp 618, the negative output 622 of the fully differential filter circuitry 612, and the negative output 610 of the MFB filter 602 are at the same node.

The fully differential MFB LPF 602 is one example of a fully differential adjustable gain device that includes cross-coupled segments that can be used to adjust the gain of the device while keeping the input impedance of the device substantially consistent and keeping the frequency response of the device substantially consistent. The term "device" as used herein can refer to a chip, a sub-circuit of a larger circuit included in a chip, a sub-circuit of a larger circuit included on a printed circuit board (PCB), or more generally, can be used to refer to a circuit. As will be described below, further embodiments of the present technology are directed to other types of fully differential adjustable gain devices that includes cross-coupled segments (similar to the cross-coupled segments 624 and 626) that can be used to adjust the gain of the device while keeping the input impedance of the device substantially consistent and keeping the frequency response of the device substantially consistent.

While it would be preferred to adjust the gain of the fully differential MFB LPF 602 (and other fully differential adjustable gain devices described herein) while keeping the input impedance of the device absolutely consistent and keeping the frequency response of the device absolutely consistent, in an actual implementation this would be very difficult if not impossible to achieve. Rather, what is achievable and acceptable is adjusting the gain of the fully differential MFB LPF 602 (and other fully differential adjustable gain devices described herein) while keeping the input impedance of the device substantially consistent and keeping the frequency response of the device substantially consistent. The term "substantially consistent" as used herein refers to within +/−10% of a specified value for a median gain setting. For example, if the specified input impedance for a device is 500 ohms, then keeping that input impedance substantially consistent would be keeping the input impedance within 500 ohms+/−10%, or more specifically, keeping the input impedance within the range of 450 ohms to 550 ohms. Similarly, in an actual implementation, keeping a specified relationship between component values of cross-coupled segments (e.g., 624 and 626 in FIG. 6) absolutely constant may also not be achievable. Rather, what is achievable and acceptable is keeping the specified relationship between component values of cross-coupled segments (e.g., 624 and 626 in FIG. 6) substantially constant, wherein the term "substantially constant" refers to within +/−10% of a specified value. For example, keeping the relationship represented in Equation(2) shown above substantially constant means keeping results of Equation(2) within +/−10% of a specified value. For example, if the result of Equation(2) for a median gain setting is the value 400, then for other gain settings that value should be kept within 400+/−10%, or more specifically, within the range of 360 and 440. In the below discussion of the embodiments of FIGS. 7-13, the term "constant" may be used for brevity but can be interpreted as meaning "substantially constant." Similarly, the term "the same" may be used for brevity but can be interpreted as meaning "substantially the same."

Figure 7:
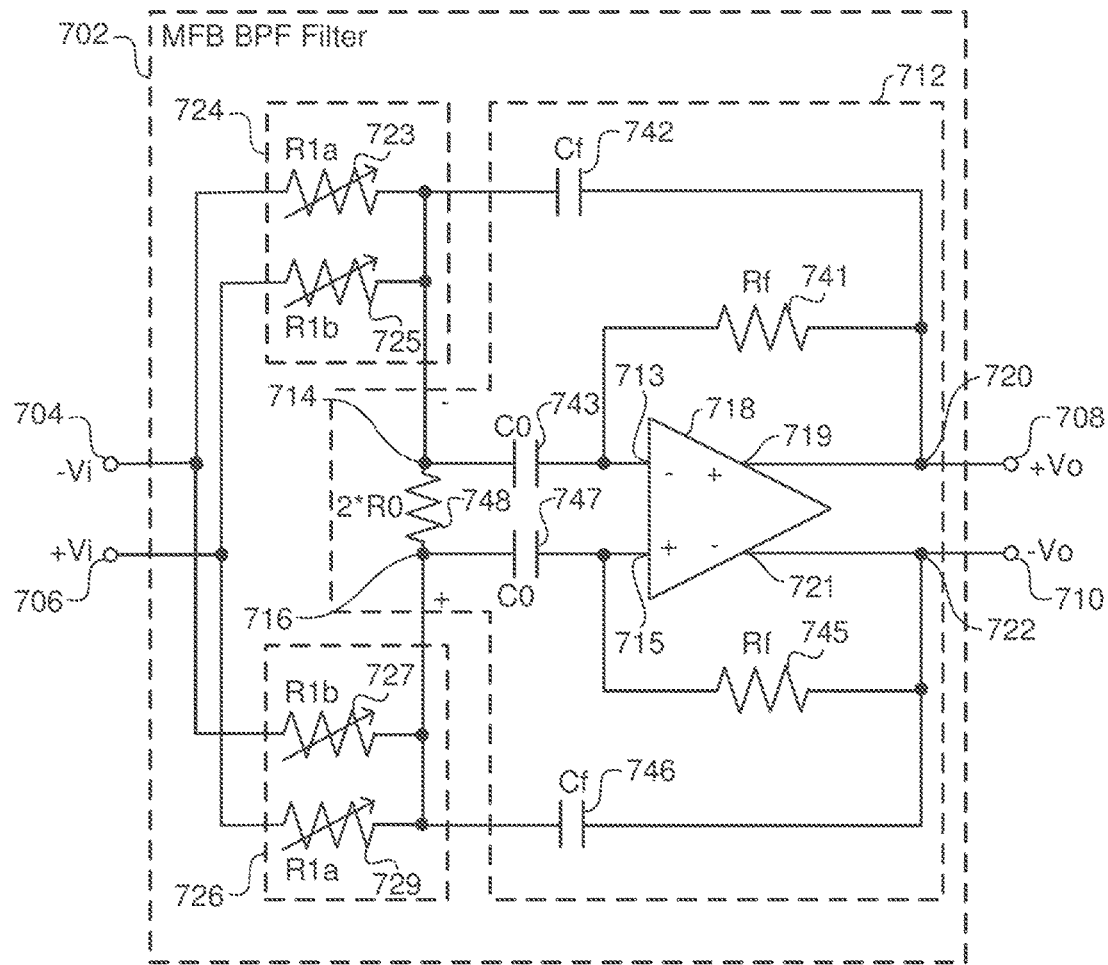
FIG. 7 illustrates a fully differential adjustable gain MFB bandpass filter (BPF), according to an embodiment of the present technology.

Referring to FIG. 7, shown therein is a fully differential MFB bandpass filter (BPF) 702, according to an embodiment of the present technology. The MFB BPF 702 can be included in a receiver, such as the receiver 404 illustrated in FIG. 4, e.g., as the MFB filter 414 shown in FIG. 4. The fully differential MFB BPF 702, which can also be referred to herein more succinctly as the MFB filter 702, is shown as having differential input terminals, including a negative (−) input terminal 704 and a positive (+) input terminal 706. The MFB filter 702 is also shown as having differential output terminals, including a positive (+) output terminal 708 and a negative (−) output terminal 710. The MFB filter 702 includes a fully differential op-amp 718 including differential inputs and differential outputs, wherein the differential inputs include a negative (−) input 713 and a positive (+) input 715, and the differential outputs include a positive (+) output 719 and a negative (−) output 721.

In the MFB filter 702, the positive (+) output 719 of the op-amp 718 is connected to the negative (−) input 713 of the op-amp 718 by a feedback resistor component 741 having a resistance value Rf. The negative (−) output 721 of the op-amp 718 is connected to the positive (+) input 715 of the op-amp 718 by a feedback resistor component 745 having the same resistance value Rf as the feedback resistor component 741. The MFB filter 702 also includes feedback capacitor components 742 and 746 that each have the same capacitance value Cf. One of the terminals of the feedback capacitor component 742 is connected to the positive (+) output 719 of the op-amp 718, and the other terminal of the feedback capacitor component 742 is connected to one of the terminals of the resistor component 748, which has a resistance value 2*R0. One of the terminals of the feedback capacitor component 746 is connected to the negative (−) output 721 of the op-amp 718, and the other terminal of the feedback capacitor component 746 is connected to the other one of the terminals of the resistor component 748. One of the terminals of a capacitor component 743, having a capacitance value C0, is connected to the negative (−) input 713 of the op-amp 718, and the other one of the terminals of the capacitor component 743 is connected to one of the terminals of the resistor component 748. One of the terminals of a capacitor component 747, having the capacitance value C0, is connected to the positive (+) input 715 of the op-amp 718, and the other one of the terminals of the capacitor component 747 is connected to the other one of the terminals of the resistor component 748.

Still referring to FIG. 7, the circuitry within the dashed lined block labeled 712 can be referred to collectively as fully differential filter circuitry 712 having differential inputs and differential outputs, wherein the differential inputs include a negative (−) input 714 and a positive (+) input 716, and the differential outputs include a positive (+) output 720 and a negative (−) output 722. The fully differential filter circuitry 712 can be referred to more generically as fully differential signal processing circuitry. In FIG. 7, the cross-coupled segment 724 is coupled between the differential input terminals 704, 706 of the MFB filter 702 and the negative (−) input 714 of the fully differential filter circuitry 712, wherein the cross-coupled segment 724 includes a resistor component 723 having a resistance value R1a, and also includes a resistor component 725 having a resistance value R1b. Additionally, the cross-coupled segment 726 is coupled between the differential input terminals 704, 706 of the MFB filter 702 and the positive (+) input 716 of the fully differential filter circuitry 712, wherein the cross-coupled segment 726 includes a resistor component 729 having the resistance value R1a (which is the same resistance as the resistor component 723), and also includes a resistor component 727 having the resistance R1b value (which is the same resistance as the resistor component 725). The resistor components 723, 725, 727 and 729 are adjustable resistor components, and thus, each can be said to have an adjustable resistance. Accordingly, the resistor components 723 and 729 can be said to have an adjustable resistance value R1a, and the resistor components 725 and 727 can be said to have an adjustable resistance value R1b.

More specifically, as can be appreciated from FIG. 7, the cross-coupled segment 724 includes the resistor component 723 having the adjustable resistance value R1a and the resistor component 725 having the adjustable resistance value R1b. The resistor component 723 is coupled between the negative (−) input terminal 704 of the MFB filter 702 and the negative (−) input 714 of the fully differential filter circuitry 712. The resistor component 725 is coupled between the positive (+) input terminal 706 of the MFB filter 702 and the negative (−) input 714 of the fully differential filter circuitry 712. As can also be appreciated from FIG. 7, the cross-coupled segment 726 includes the resistor component 729 having the adjustable resistance value R1a and the resistor component 727 having the adjustable resistance value R1b. The resistor component 729 is coupled between the positive (+) input terminal 706 of the MFB filter 702 and the positive (+) input 716 of the fully differential filter circuitry 712. The resistor component 727 is coupled between the negative (−) input terminal 704 of the MFB filter 702 and the positive (+) input 716 of the fully differential filter circuitry 712.

Vo(s)/Vi(s) for the fully differential MFB BPF 702 is shown in the following Equation(3):

$$\frac{Vo(s)}{Vi(s)} = -\text{Gain} * \frac{s * \frac{-1}{Cf * Rf}}{s^2 + s * \frac{1}{Rf} * \left(\frac{1}{C0} + \frac{1}{Cf}\right) + \frac{1 + R0/R1}{C0 * Cf * R0 * Rf}}$$

where,
Vi(s) is the voltage of the differential input signal,
Vo(s) is the voltage of the differential output signal,
Gain is equal to (Rf/R1b)−(Rf/R1a),
R0 is half the resistance of the resistor component 748,
R1 is equal to (R1a*R1b)/(R1a+R1b),
R1a is the resistance of each of the resistor components 723 and 729,
R1b is the resistance of each of the resistor components 725 and 727,
Rf is the resistance of each of the feedback resistor components 741 and 745,
Cf is the capacitance of each of the feedback capacitor components 742 and 746, and
s is a variable that represents complex frequency.

Beneficially, the gain of the fully differential MFB BPF 702 can be adjusted, without substantially affecting a frequency response and without substantially affecting an input impedance of the fully differential MFB BPF 702 (i.e., while keeping the frequency response substantially consistent and the input impedance substantially consistent of the fully differential MFB BPF 702), by only adjusting the resistance R1$a$ (which is the resistance of each of the resistor component 723 of the cross-coupled segment 724 and the resistor component 729 of the cross-coupled segment 726), and adjusting the resistance R1$b$ (which is the resistance of each of the resistor component 725 of the cross-coupled segment 724 and the resistor component 727 of the cross-coupled segment 726). Accordingly, the other passive components of the MFB filter 702 need not be adjusted and can have fixed component values. The described embodiment enables the MFB filter 702 to be implemented in a relatively small die area, with relatively easy gain control. The condition that needs to be met, to keep the frequency response substantially consistent and the input impedance substantially consistent of the fully differential MFB BPF 702, is keeping substantially constant a specified relationship between component values of the cross-coupled segments 724 and 726. More specifically, the gain of the MFB filter 702 can be adjusted, while keeping the frequency response of the MFB filter 702 substantially consistent and keeping the input impedance of the MFB filter 702 substantially consistent, by adjusting a value of the adjustable resistance R1$a$ and a value of adjustable resistance R1$b$, which are resistance values of resistor components included in each of the cross-coupled segments 724 and 726, while keeping substantially constant the following Equation(2):

$$\frac{R1a * R1b}{R1a + R1b}.$$

Figure 8:
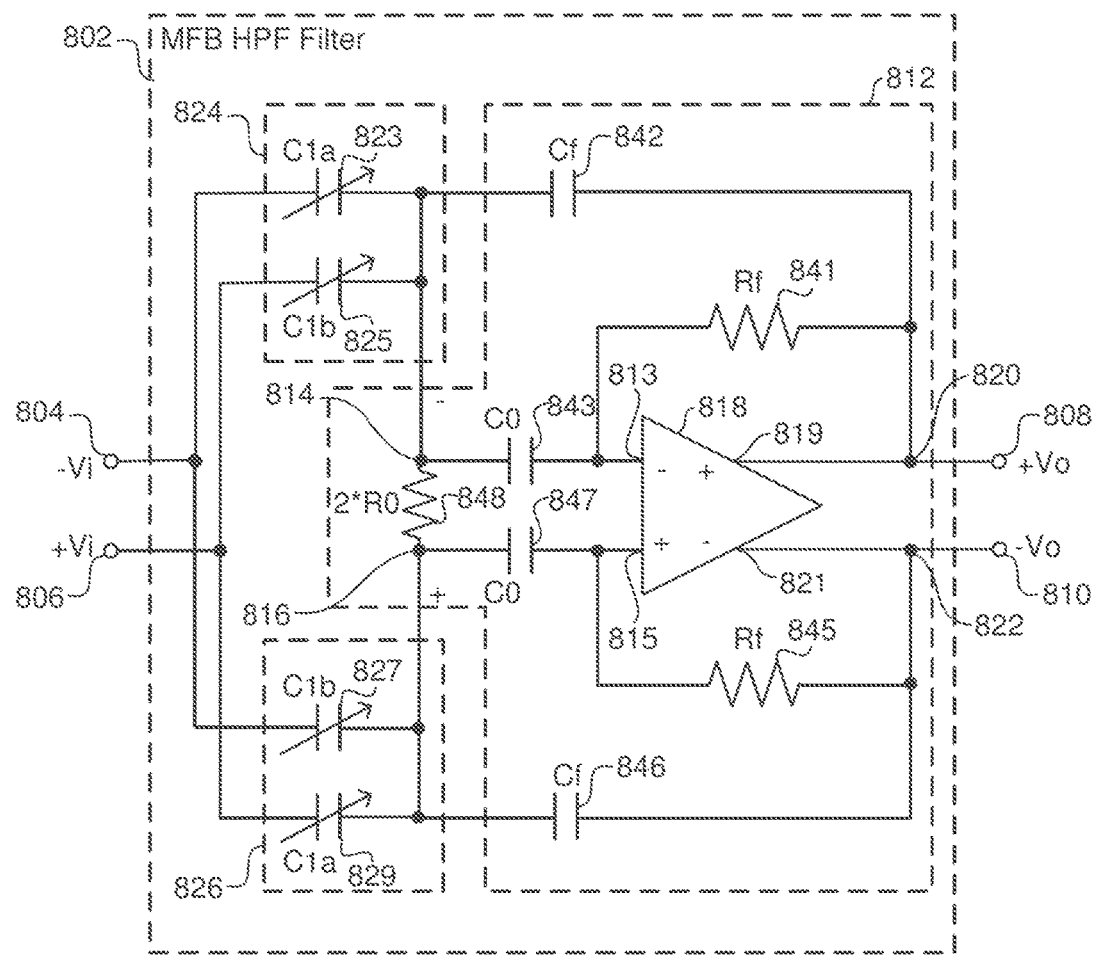
FIG. 8 illustrates a fully differential adjustable gain MFB high pass filter (HPF), according to an embodiment of the present technology.

Referring now to FIG. 8, shown therein is a fully differential MFB high pass filter (HPF) 802, according to an embodiment of the present technology. The MFB HPF 802 can be included in a receiver, such as the receiver 404 illustrated in FIG. 4, e.g., as the MFB filter 414 shown in FIG. 4. The fully differential MFB HPF 802, which can also be referred to herein more succinctly as the MFB filter 802, is shown as having differential input terminals, including a negative (−) input terminal 804 and a positive (+) input terminal 806. The MFB filter 802 is also shown as having differential output terminals, including a positive (+) output terminal 808 and a negative (−) output terminal 810. The MFB filter 802 includes a fully differential op-amp 818 including differential inputs and differential outputs, wherein the differential inputs include a negative (−) input 813 and a positive (+) input 815, and the differential outputs include a positive (+) output 819 and a negative (−) output 821. The MFB HPF filter 802 is a fully differential filter because it includes both differential inputs and differential outputs.

In the MFB filter 802, the positive (+) output 819 of the op-amp 818 is connected to the negative (−) input 813 of the op-amp 818 by a feedback resistor component 841 having a resistance value Rf. The negative (−) output 821 of the op-amp 818 is connected to the positive (+) input 815 of the op-amp 818 by a feedback resistor component 845 having the same resistance value Rf as the feedback resistor component 841. The MFB filter 802 also includes feedback capacitor components 842 and 846 that each have the same capacitance value Cf. One of the terminals of the feedback capacitor component 842 is connected to the positive (+) output 819 of the op-amp 818, and the other terminal of the feedback capacitor component 842 is connected to one of the terminals of the resistor component 848, which has a resistance value 2*R0. One of the terminals of the feedback capacitor component 846 is connected to the negative (−) output 821 of the op-amp 818, and the other terminal of the feedback capacitor component 846 is connected to the other one of the terminals of the resistor component 848. One of the terminals of a capacitor component 843, having a capacitance value C0, is connected to the negative (−) input 813 of the op-amp 818, and the other one of the terminals of the capacitor component 843 is connected to one of the terminals of the resistor component 848. One of the terminals of a capacitor component 847, having the capacitance value C0, is connected to the positive (+) input 815 of the op-amp 818, and the other one of the terminals of the capacitor component 847 is connected to the other one of the terminals of the resistor component 848.

Still referring to FIG. 8, the circuitry within the dashed lined block labeled 812 can be referred to collectively as fully differential filter circuitry 812 having differential inputs and differential outputs, wherein the differential inputs include a negative (−) input 814 and a positive (+) input 816, and the differential outputs include a positive (+) output 820 and a negative (−) output 822. The fully differential filter circuitry 812 can be referred to more generically as fully differential signal processing circuitry. In FIG. 8, the cross-coupled segment 824 is coupled between the differential input terminals 804, 806 of the MFB filter 802 and the negative (−) input 814 of the fully differential filter circuitry 812, wherein the cross-coupled segment 824 includes a capacitor component 823 having a capacitance value C1$a$, and also includes a capacitor component 825 having a capacitance value C1$b$. The cross-coupled segment 826 is coupled between the differential input terminals 804, 806 of the MFB filter 802 and the positive (+) input 816 of the fully differential filter circuitry 812, wherein the cross-coupled segment 826 includes a capacitor component 829 having the capacitance value C1$a$ (which is the same capacitance as the capacitor component 823), and also includes a capacitor component 827 having the capacitance C1$b$ value (which is the same capacitance as the capacitor component 825). The capacitor components 823, 825, 827 and 829 are adjustable capacitor components, and thus, each can be said to have an adjustable capacitance. Accordingly, the capacitor components 823 and 829 can be said to have an adjustable capacitance value C1$a$, and the capacitor components 825 and 827 can be said to have an adjustable capacitance value C1$b$.

More specifically, as can be appreciated from FIG. 8, the cross-coupled segment 824 includes the capacitor component 823 having the adjustable capacitance value C1$a$ and the capacitor component 825 having the adjustable capacitance value C1$b$. The capacitor component 823 is coupled between the negative (−) input terminal 804 of the MFB filter 802 and the negative (−) input 814 of the fully differential filter circuitry 812. The capacitor component 825 is coupled between the positive (+) input terminal 806 of the MFB filter 802 and the negative (−) input 814 of the fully differential filter circuitry 812. As can also be appreciated from FIG. 8, the cross-coupled segment 826 includes the capacitor component 829 having the adjustable capacitance value C1$a$ and the capacitor component 827 having the adjustable capacitance value C1$b$. The capacitor component 829 is coupled between the positive (+) input terminal 806 of the MFB filter 802 and the positive (+) input 816 of the fully differential filter circuitry 812. The capacitor component 827 is coupled between the negative (−) input terminal 804 of the MFB filter 802 and the positive (+) input 816 of the fully differential filter circuitry 812.

Vo(s)/Vi(s) for the fully differential MFB HPF 802 is shown in the following Equation(4):

$$\frac{Vo(s)}{Vi(s)} = \text{Gain} * \frac{s*C0*Cf*Rf}{s^2 + C0*Cf*Rf + s(C0 + C1 + Cf) + \frac{1}{R0}}$$

where,
Vi(s) is the voltage of the differential input signal,
Vo(s) is the voltage of the differential output signal,
Gain is equal to (C1a−C1b)/Cf,
R0 is half the resistance of the resistor component 848,
C1 is equal to C1a+C1b,
C1a is the capacitance of each of the capacitor components 823 and 829,
C1b is the capacitance of each of the capacitor components 825 and 827,
Rf is the resistance of each of the feedback resistor components 841 and 845,
Cf is the capacitance of each of the feedback capacitor components 842 and 846, and
s is a variable that represents complex frequency.

Beneficially, the gain of the fully differential MFB HPF 802 can be adjusted, without substantially affecting a frequency response and without substantially affecting an input impedance of the fully differential MFB HPF 802 (i.e., while keeping the frequency response substantially consistent and the input impedance substantially consistent of the fully differential MFB HPF 802), by only adjusting capacitance C1a (which is the capacitance of each of the capacitor component 823 of the cross-coupled segment 824 and the capacitor component 829 of the cross-coupled segment 826), and adjusting the capacitance C1b (which is the capacitance of each of the capacitor component 825 of the cross-coupled segment 824 and the capacitor component 827 of the cross-coupled segment 826). Accordingly, the other passive components of the MFB filter 802 need not be adjusted and can have fixed component values. The described embodiment enables the MFB filter 802 to be implemented in a relatively small die area, with relatively easy gain control. The condition that needs to be met, to keep the frequency response substantially consistent and the input impedance substantially consistent of the fully differential MFB HPF 802, is keeping substantially constant a specified relationship between component values of the cross-coupled segments 824 and 826. More specifically, the gain of the MFB filter 802 can be adjusted, while keeping the frequency response of the MFB filter 802 substantially consistent and keeping the input impedance of the MFB filter 802 substantially consistent, by adjusting a value of the adjustable capacitance C1a and a value of adjustable capacitance C1b, which are capacitance values of capacitor components included in each of the cross-coupled segments 824 and 826, while keeping substantially constant the following Equation(5): C1a+C1b.

In the embodiment of FIG. 8, the positive (+) output 819 of the op-amp 818, the positive output 820 of the fully differential filter circuitry 812, and the positive output 808 of the MFB filter 802 are at the same node. Similarly, in the embodiment of FIG. 8, the negative (−) output 821 of the op-amp 818, the negative output 822 of the fully differential filter circuitry 812, and the negative output 810 of the MFB filter 802 are at the same node.

Figure 9:
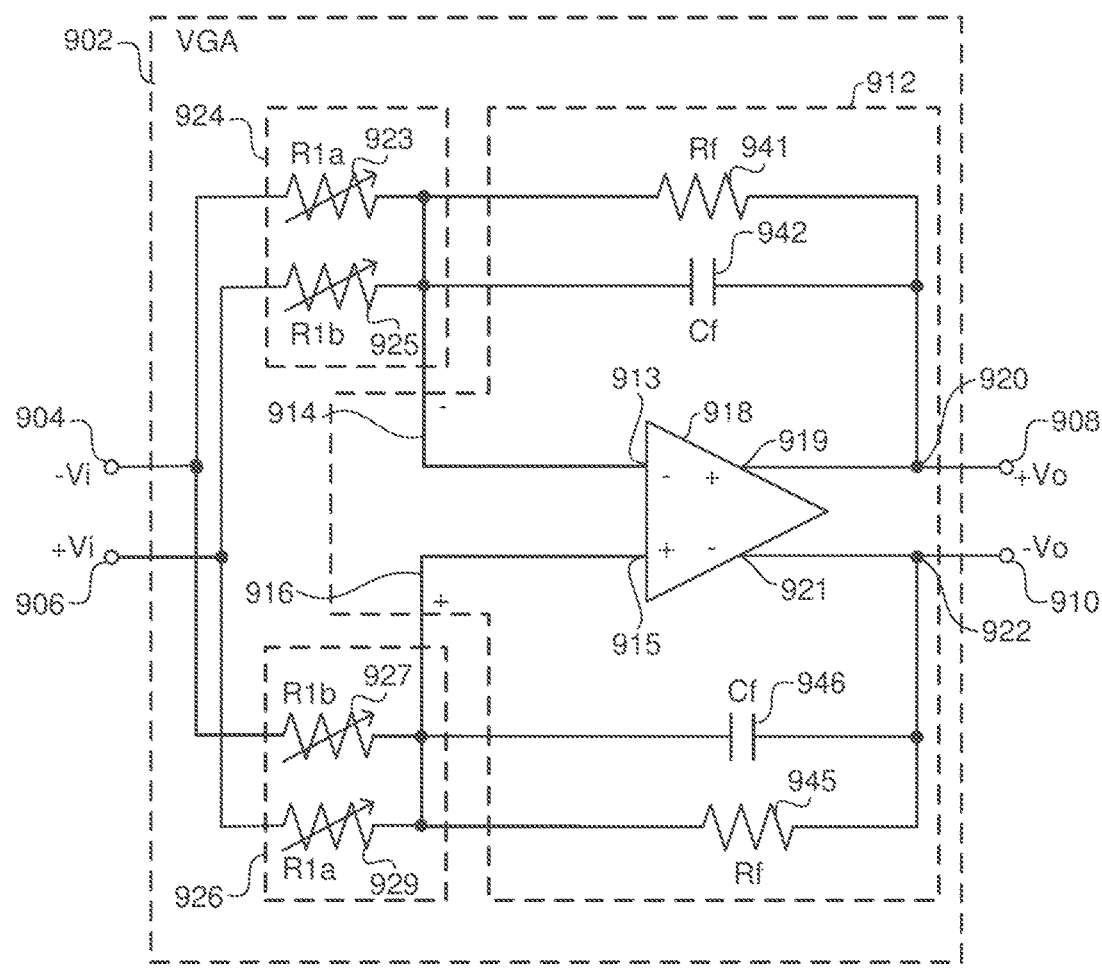
FIG. 9 illustrates a fully differential variable gain amplifier (VGA), according to an embodiment of the present technology, which fully differential VGA can be included in a receiver, such as the receiver illustrated in FIG. 4, but is not limited thereto.

Referring now to FIG. 9, shown therein is a fully differential variable gain amplifier (VGA) 902, according to an embodiment of the present technology. The VGA 902 can be included in a receiver, such as the receiver 404 illustrated in FIG. 4, e.g., as the VGA 416 shown in FIG. 4. The fully differential VGA 902, which can also be referred to herein more succinctly as the VGA 902, is shown as having differential input terminals, including a negative (−) input terminal 904 and a positive (+) input terminal 906. The VGA 902 is also shown as having differential output terminals, including a positive (+) output terminal 908 and a negative (−) output terminal 910. The VGA 902 includes a fully differential op-amp 918 including differential inputs and differential outputs, wherein the differential inputs include a negative (−) input 913 and a positive (+) input 915, and the differential outputs include a positive (+) output 919 and a negative (−) output 921. The FGA 902 is a fully differential amplifier because it includes both differential inputs and differential outputs.

In the VGA 902, the positive (+) output 919 of the op-amp 918 is connected to the negative (−) input 913 of the op-amp 918 by a feedback capacitor component 942 having a capacitance value Cf. The negative (−) output 921 of the op-amp 918 is connected to the positive (+) input 915 of the op-amp 918 by a feedback capacitor component 946 having the same capacitance value Cf as the feedback capacitor component 942. The VGA 902 also includes feedback resistor components 941 and 945 that each have the same resistance value Rf. The feedback resistor component 941 is connected in parallel with the feedback capacitor component 942, and thus, the positive (+) output 919 of the op-amp 918 is also connected to the negative (−) input 913 of the op-amp 918 by the feedback resistor component 941 having a resistance value Rf. The feedback resistor component 945 is connected in parallel with the feedback capacitor component 946, and thus, the negative (−) output 921 of the op-amp 918 is also connected to the positive (+) input 915 of the op-amp 918 by the feedback resistor component 945 having the same resistance value Rf as the feedback resistor component 941.

Still referring to FIG. 9, the circuitry within the dashed lined block labeled 912 can be referred to collectively as fully differential gain circuitry 912 having differential inputs and differential outputs, wherein the differential inputs include a negative (−) input 914 and a positive (+) input 916, and the differential outputs include a positive (+) output 920 and a negative (−) output 922. The fully differential filter circuitry 912 can be referred to more generically as fully differential signal processing circuitry. In FIG. 9, the cross-coupled segment 924 is coupled between the differential input terminals 904, 906 of the VGA 902 and the negative (−) input 914 of the fully differential filter circuitry 912, wherein the cross-coupled segment 924 includes a resistor component 923 having a resistance value R1a, and also includes a resistor component 925 having a resistance value R1b. Additionally, the cross-coupled segment 926 is coupled between the differential input terminals 904, 906 of the VGA 902 and the positive (+) input 916 of the fully differential filter circuitry 912, wherein the cross-coupled segment 926 includes a resistor component 929 having the resistance value R1a (which is the same resistance as the resistor component 923), and also includes a resistor component 927 having the resistance R1b value (which is the same resistance as the resistor component 925). The resistor components 923, 925, 927 and 929 are adjustable resistor components, and thus, each can be said to have an adjustable resistance. Accordingly, the resistor components 923 and 929 can be said to have an adjustable resistance value R1$a$, and the resistor components 925 and 927 can be said to have an adjustable resistance value R1$b$.

More specifically, as can be appreciated from FIG. 9, the cross-coupled segment 924 includes the resistor component 923 having the adjustable resistance value R1$a$ and the resistor component 925 having the adjustable resistance value R1$b$. The resistor component 923 is coupled between the negative (−) input terminal 904 of the VGA 902 and the negative (−) input 914 of the fully differential filter circuitry 912. The resistor component 925 is coupled between the positive (+) input terminal 906 of the VGA 902 and the negative (−) input 914 of the fully differential filter circuitry 912. As can also be appreciated from FIG. 9, the cross-coupled segment 926 includes the resistor component 929 having the adjustable resistance value R1$a$ and the resistor component 927 having the adjustable resistance value R1$b$. The resistor component 929 is coupled between the positive (+) input terminal 906 of the VGA 902 and the positive (+) input 916 of the fully differential filter circuitry 912. The resistor component 927 is coupled between the negative (−) input terminal 904 of the VGA 902 and the positive (+) input 916 of the fully differential filter circuitry 912.

Vo(s)/Vi(s) for the fully differential VGA 902 is shown in the following Equation(6):

$$\frac{Vo(s)}{Vi(s)} = -\text{Gain} * \frac{1}{1 + (s * Rf * Cf)}$$

where,
Vi(s) is the voltage of the differential input signal,
Vo(s) is the voltage of the differential output signal,
Gain is equal to Rf*(R1$a$-R1$b$)/(R1$a$*R1$b$),
R1$a$ is the resistance of each of the resistor components 923 and 929,
R1$b$ is the resistance of each of the resistor components 925 and 927,
Rf is the resistance of each of the feedback resistor components 941 and 945,
Cf is the capacitance of each of the feedback capacitor components 942 and 946, and
s is a variable that represents complex frequency.

Beneficially, the gain of the VGA 902 can be adjusted, without substantially affecting a frequency response and without substantially affecting an input impedance of the fully differential VGA 902 (i.e., while keeping the frequency response of the fully differential VGA 902 substantially consistent, and keeping the input impedance of the fully differential VGA 902 substantially consistent), by only adjusting resistance R1$a$ (which is the resistance of each of the resistor component 923 of the cross-coupled segment 924 and the resistor component 929 of the cross-coupled segment 926), and adjusting the resistance R1$b$ (which is the resistance of each of the resistor component 925 of the cross-coupled segment 924 and the resistor component 927 of the cross-coupled segment 926). Accordingly, the other passive components of the VGA 902 need not be adjusted and can have fixed component values. The described embodiment enables the VGA 902 to be implemented in a relatively small die area, with relatively easy gain control. The condition that needs to be met, to keep the frequency response substantially consistent and the input impedance substantially consistent of the fully differential VGA 902, is keeping substantially constant a specified relationship between component values of the cross-coupled segments 924 and 926. More specifically, the gain of the VGA 902 can be adjusted, while keeping the frequency response of the VGA 902 substantially consistent and the input impedance of the VGA substantially consistent, by adjusting a value of the adjustable resistance R1$a$ and a value of adjustable resistance R1$b$, which are resistance values of resistor components included in each of the cross-coupled segments 924 and 926, while keeping substantially constant the following Equation(2):

$$\frac{R1a * R1b}{R1a + R1b}.$$

In the embodiment of FIG. 9, the positive (+) output 919 of the op-amp 918, the positive output 920 of the fully differential filter circuitry 912, and the positive output 908 of the VGA 902 are at the same node. Similarly, in the embodiment of FIG. 9, the negative (−) output 921 of the op-amp 918, the negative output 922 of the fully differential filter circuitry 912, and the negative output 910 of the VGA 902 are at the same node.

Figure 10:
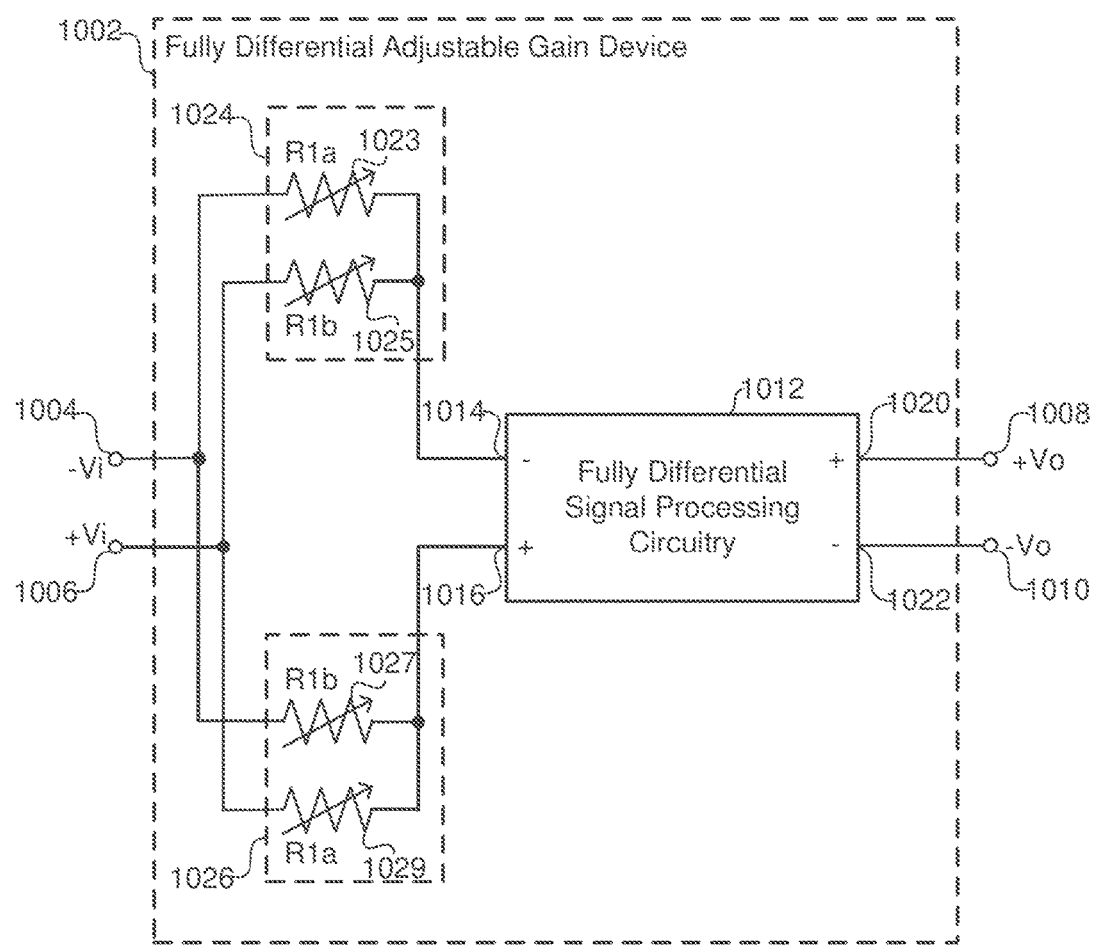
FIG. 10 illustrates a fully differential adjustable gain device having cross-coupled segments that include resistor components, according to an embodiment of the present technology.

As was mentioned above in the discussions of FIGS. 6, 7, 8 and 9, the circuitry within the dashed lined blocks labeled 612, 712, 812, and 912 (in FIGS. 6, 7, 8 and 9, respectively) can be referred to generically as fully differential signal processing circuitry. Referring now to FIG. 10, illustrated therein is a fully differential adjustable gain device 1002 that includes differential input terminals including a negative (−) input terminal 1004 and a positive (+) input terminal 1006, and differential output terminals including a positive (+) output terminal 1008 and a negative (−) output terminal 1010. The fully differential adjustable gain device 1002 is shown as including fully differential signal processing circuitry 1012 including differential inputs and differential outputs, the differential inputs including a negative (−) input 1014 and a positive (+) input 1016, the differential outputs including a positive (+) output 1020 and a negative (−) output 1022. The positive (+) output 1020 of the fully differential signal processing circuitry 1012 provides the positive (+) output terminal 1008 of the fully differential adjustable gain device 1002. The negative (−) output 1022 of the fully differential signal processing circuitry 1012 provides the negative (−) output terminal 1010 of the fully differential adjustable gain device 1002. A first cross-coupled segment 1024 is coupled between the differential input terminals 1004, 1006 of the fully differential adjustable gain device 1002 and the negative (−) input 1014 of the fully differential signal processing circuitry 1012. A second cross-coupled segment 1026 is coupled between the differential input terminals 1004, 1006 of the fully differential adjustable gain device 1002 and the positive (+) input 1016 of the fully differential signal processing circuitry 1012. As can be appreciated from the above discussion of FIGS. 6, 7, 8, and 9, the fully differential signal processing circuitry 1012 can be block 612 in FIG. 6, block 712 in FIG. 7, or block 912 in FIG. 9, but is not limited thereto. As can be appreciated from the above discussion of FIGS. 6, 7, 8, and 9, the cross-coupled segment 1024 can be the cross-coupled segment 624 in FIG. 6, 724 in FIG. 7, or 924 in FIG. 9; and the cross-coupled segment 1026 can be the cross-coupled segment 626 in FIG. 6, 726 in FIG. 7, or 926 in FIG. 9. As can be appreciated from the above discussion of FIGS. 6, 7, and 9, the fully differential adjustable gain device 1002 has a gain that is adjustable by adjusting one or more component values of the cross-coupled segments 1024 and 1026, while maintaining a substantially consistent frequency response and a substantially consistent input impedance of the fully differential adjustable gain device, so long as a specified relationship between the component values of the cross-coupled segments 1024 and 1026 is kept substantially constant. In FIG. 10, the cross-coupled segments 1024 and 1026 are shown as including resistor components (1023, 1025, 1027 and 1029), as was also the case in the embodiments described above with reference to FIGS. 6, 7, and 9. However, as was described above with reference to FIG. 8, cross-coupled segments can alternatively include capacitor components. It is also possible that cross-coupled segments include inductor components, as will be described below with reference to FIG. 13. The adjustable gain device 1002 is a fully differential device because it includes both differential inputs and differential outputs.

More generally, in accordance with certain embodiments of the present technology, a first cross-coupled segment (e.g., 624, 724, 824, 924, or 1024) includes a first passive component having a first adjustable component value (e.g., R1a or C1a) and a second passive component having a second adjustable component value (e.g., R1b or C1b), wherein the first passive component is coupled between the negative (−) input terminal of the fully differential adjustable gain device and the negative (−) input of the fully differential signal processing circuitry, and the second passive component is coupled between the positive (+) input terminal of the fully differential adjustable gain device and the negative (−) input of the fully differential signal processing circuitry. Similarly, a second cross-coupled segment (e.g., 626, 726, 826, 926, or 1026) includes a third passive component having the first adjustable component value (e.g., R1a or C1a) and a fourth passive component having the second adjustable component value (e.g., R1b or C1b), wherein the third passive component is coupled between the positive (+) input terminal of the fully differential adjustable gain device and the positive (+) input of the fully differential signal processing circuitry, and the fourth passive component is coupled between the negative (−) input terminal of the fully differential adjustable gain device and the positive (+) input of the fully differential signal processing circuitry.

Figure 11:
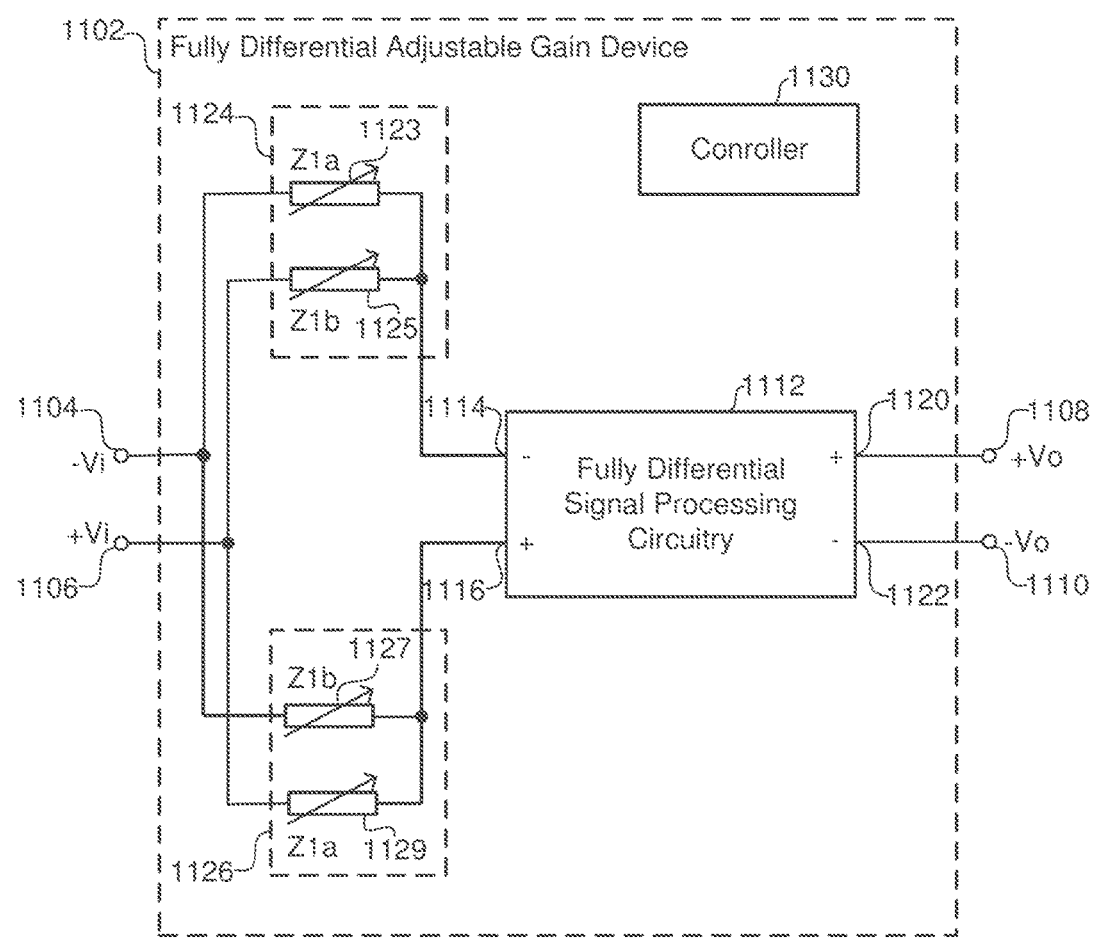
FIG. 11 illustrates a fully differential adjustable gain device having cross-coupled segments that include impedance components, according to an embodiment of the present technology.

Passive components, such as resistors, capacitor, and inductors, can also be referred to as impedance components that have impedance values. Where the passive components have adjustable values, they can be referred to as adjustable impedance components that have adjustable impedance values. FIG. 11 illustrates more generally how a fully differential adjustable gain device 1102 can include differential input terminals including a negative (−) input terminal 1104 and a positive (+) input terminal 1106, and differential output terminals including a positive (+) output terminal 1108 and a negative (−) output terminal 1110. The fully differential adjustable gain device 1102 is shown as including fully differential signal processing circuitry 1112 including differential inputs and differential outputs, the differential inputs including a negative (−) input 1114 and a positive (+) input 1116, the differential outputs including a positive (+) output 1120 and a negative (−) output 1122. The positive (+) output 1120 of the fully differential signal processing circuitry 1112 provides the positive (+) output terminal 1108 of the fully differential adjustable gain device 1102. The negative (−) output 1122 of the fully differential signal processing circuitry 1112 provides the negative (−) output terminal 1110 of the fully differential adjustable gain device 1102. A first cross-coupled segment 1124 is coupled between the differential input terminals 1104, 1106 of the fully differential adjustable gain device 1102 and the negative (−) input 1114 of the fully differential signal processing circuitry 1124. A second cross-coupled segment 1126 is coupled between the differential input terminals 1104, 1106 of the fully differential adjustable gain device 1102 and the positive (+) input 1116 of the fully differential signal processing circuitry 1112. The adjustable gain device 1102 is a fully differential device because it includes both differential inputs and differential outputs.

As can be appreciated from the above discussion of FIGS. 6, 7, 8, and 9, the fully differential signal processing circuitry 1112 can be block 612 in FIG. 6, block 712 in FIG. 7, block 812 in FIG. 8, or block 912 in FIG. 9, but is not limited thereto. As can be appreciated from the above discussion of FIGS. 6, 7, 8, and 9, the cross-coupled segment 1124 can be the cross-coupled segment 624 in FIG. 6, 724 in FIG. 7, 824 in FIG. 8, or 924 in FIG. 9; and the cross-coupled segment 1126 can be the cross-coupled segment 626 in FIG. 6, 726 in FIG. 7, 826 in FIG. 8, or 926 in FIG. 9. As can be appreciated from the above discussion of FIGS. 6, 7, 8, and 9, the fully differential adjustable gain device 1102 has a gain that is adjustable by adjusting one or more impedance values of the cross-coupled segments 1124 and 1126, while maintaining a substantially consistent frequency response and a substantially consistent input impedance of the fully differential adjustable gain device 1102, so long as a specified relationship between the impedance values of the cross-coupled segments 1124 and 1126 is kept substantially constant for any given value of the complex frequency variables.

In FIG. 11, the cross-coupled segment 1124 is shown as including impedance component 1123 having an adjustable impedance value $Z1a$, and an impedance component 1125 having an adjustable impedance value $Z1b$; and the cross-coupled segment 1126 is shown as including impedance component 1129 having the adjustable impedance value $Z1a$, and an impedance component 1127 having the adjustable impedance value $Z1b$. The gain of the fully differential adjustable gain device 1102 is adjustable by adjusting the first adjustable impedance value ($Z1a$) of each of the impedance component 1123 of the cross-coupled segment 1124 and the impedance component 1129 of the cross-coupled segment 1126, and adjusting the second adjustable impedance value ($Z1b$) of each of the impedance component 1125 of the cross-coupled segment 1124 and the impedance component 1127 of the cross-coupled segment 1126. The specified relationship between the component values of the cross-coupled segments 1124 and 1126 that is kept constant for any given value of s is the following Equation(7):

$$\frac{Z1a(s) * Z1b(s)}{Z1a(s) + Z1b(s)}.$$

FIG. 11 also shows a controller 1130, which can be part of the fully differential adjustable gain device 1102 or can be external thereto and in communication with the fully differential adjustable gain device 1102. The controller 1130 can be used to adjust the values of the adjustable impedance values ($Z1a$ and $Z1b$) of the impedance components 1123, 1125, 1127, and 1129 included in the cross-coupled segments 1124 and 1126 to achieve different gain settings while keeping the frequency response of the fully differential adjustable gain device 1102 substantially consistent, and keeping the input impedance of the fully differential adjustable gain device 1102 substantially consistent. The controller 1130 can be implemented using a processor, a state machine, or an application specific integrated circuit (ASIC), but is not limited thereto. For an example, where each of the impedance components 1123, 1125, 1127, and 1129 is implemented using a bank of resistor, capacitor, and/or inductor components, the controller 1130 can control switches (not shown) to switch various passive components of the bank into or out of the circuit to achieve a desired impedance value. The other embodiments described herein, including those described with reference to FIGS. 6-10 and 12-13 can also be under the control of a similar controller 1130 that is part of the device shown in the FIG., or is external to the device. In other words, while controllers are not shown in the other FIGS., each such other FIG. can also have been shown to include a similar controller.

Figure 12:
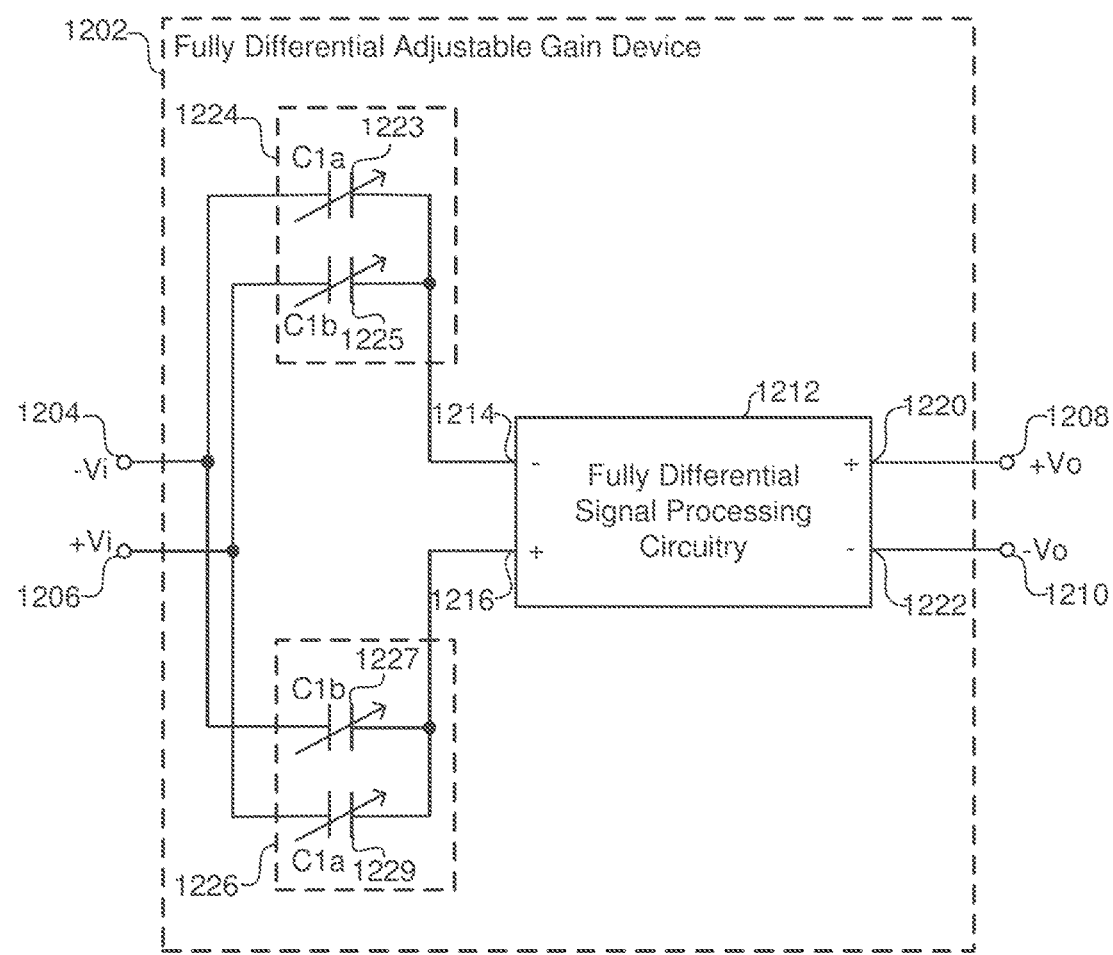
FIG. 12 illustrates a fully differential adjustable gain device having cross-coupled segments that include capacitor components, according to an embodiment of the present technology.

FIG. 12 is similar to FIGS. 10 and 11 in that it shows a fully differential adjustable gain device 1202 can include differential input terminals including a negative (−) input terminal 1204 and a positive (+) input terminal 1206, and differential output terminals including a positive (+) output terminal 1208 and a negative (−) output terminal 1210. The fully differential adjustable gain device 1202 is shown as including fully differential signal processing circuitry 1212 including differential inputs and differential outputs, the differential inputs including a negative (−) input 1214 and a positive (+) input 1216, the differential outputs including a positive (+) output 1230 and a negative (−) output 1222. The positive (+) output 1220 of the fully differential signal processing circuitry 1212 provides the positive (+) output terminal 1208 of the fully differential adjustable gain device 1202. The negative (−) output 1222 of the fully differential signal processing circuitry 1212 provides the negative (−) output terminal 1210 of the fully differential adjustable gain device 1202. A first cross-coupled segment 1224 is coupled between the differential input terminals 1204, 1206 of the fully differential adjustable gain device 1202 and the negative (−) input 1214 of the fully differential signal processing circuitry 1224. A second cross-coupled segment 1226 is coupled between the differential input terminals 1204, 1206 of the fully differential adjustable gain device 1202 and the positive (+) input 1216 of the fully differential signal processing circuitry 1212. The adjustable gain device 1202 is a fully differential device because it includes both differential inputs and differential outputs.

In FIG. 12, the cross-coupled segment 1224 is shown as including capacitor component 1223 (which is a type of impedance component) having an adjustable capacitance value C1$a$, and a capacitor component 1225 having an adjustable capacitance value C1$b$; and the cross-coupled segment 1226 is shown as including a capacitor component 1229 having the adjustable capacitance value C1$a$, and a capacitor component 1227 having the adjustable capacitance value C1$b$. Such capacitor components are specific types of impedance components, and such capacitance values are specific types of impedance values. The gain of the fully differential adjustable gain device 1202 is adjustable by adjusting the adjustable capacitor value (C1$a$) of each of the capacitor component 1223 of the cross-coupled segment 1224 and the capacitor component 1229 of the cross-coupled segment 1226, and the adjustable capacitor value (C1$b$) of each of the capacitor component 1225 of the cross-coupled segment 1224 and the capacitor component 1227 of the cross-coupled segment 1226. The impedance of each of the capacitor components 1223 and 1229 is equal to $1/(s*C1a)$; and the impedance of each of the capacitor components 1225 and 1227 is equal to $1/(s*C1b)$. The specified relationship between the component values of the cross-coupled segments 1224 and 1226 that is kept substantially constant (i.e., in order to keep the frequency response of the fully differential adjustable gain device 1202 substantially consistent, and keep the input impedance of the fully differential adjustable gain device 1202 substantially consistent) is the following Equation(5): C1$a$+C1$b$.

Figure 13:
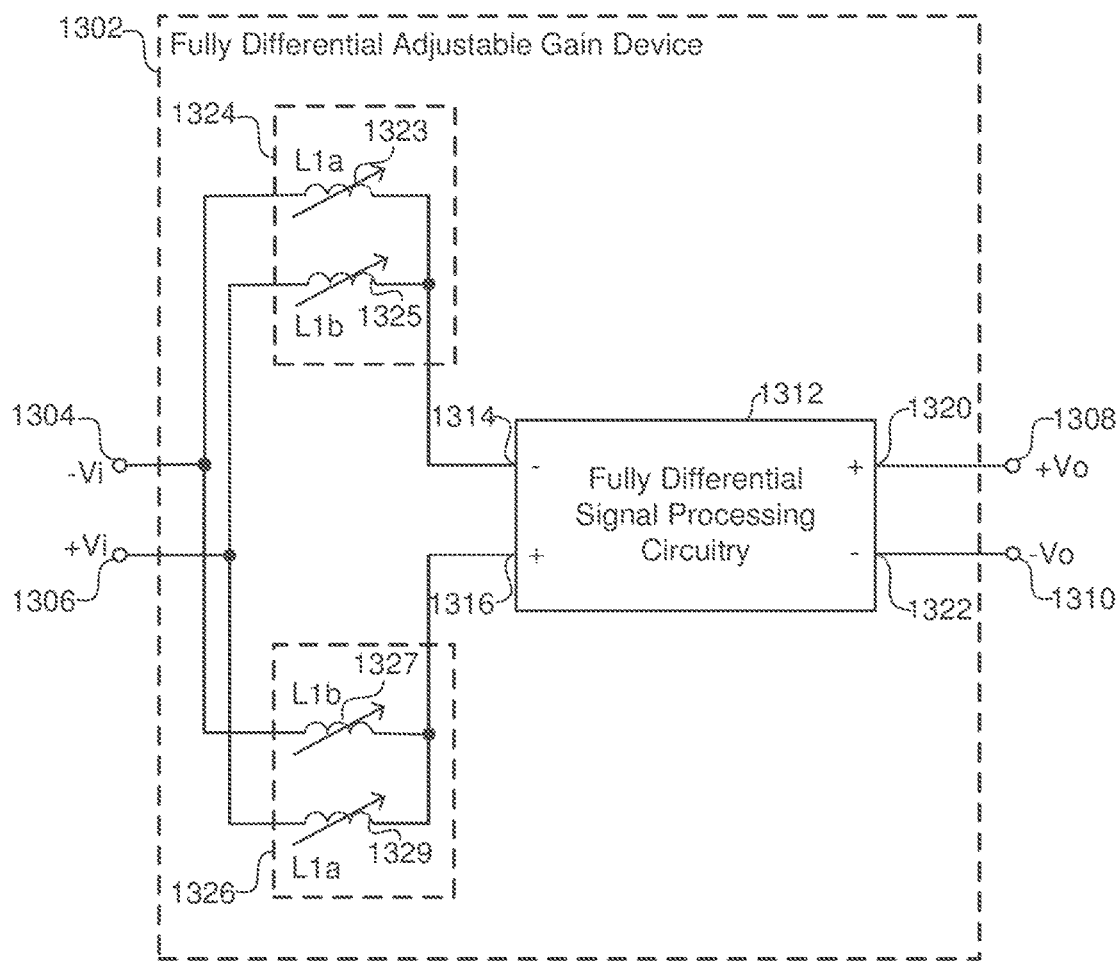
FIG. 13 illustrates a fully differential adjustable gain device having cross-coupled segments that include inductor components, according to an embodiment of the present technology.

FIG. 13 is similar to FIGS. 10, 11 and 12 in that it is shows a fully differential adjustable gain device 1302 can include differential input terminals including a negative (−) input terminal 1304 and a positive (+) input terminal 1306, and differential output terminals including a positive (+) output terminal 1308 and a negative (−) output terminal 1310. The fully differential adjustable gain device 1302 is shown as including fully differential signal processing circuitry 1312 including differential inputs and differential outputs, the differential inputs including a negative (−) input 1314 and a positive (+) input 1316, the differential outputs including a positive (+) output 1320 and a negative (−) output 1322. The positive (+) output 1320 of the fully differential signal processing circuitry 1312 provides the positive (+) output terminal 1308 of the fully differential adjustable gain device 1302. The negative (−) output 1322 of the fully differential signal processing circuitry 1312 provides the negative (−) output terminal 1310 of the fully differential adjustable gain device 1302. A first cross-coupled segment 1324 is coupled between the differential input terminals 1304, 1306 of the fully differential adjustable gain device 1302 and the negative (−) input 1314 of the fully differential signal processing circuitry 1312. A second cross-coupled segment 1326 is coupled between the differential input terminals 1304, 1306 of the fully differential adjustable gain device 1302 and the positive (+) input 1316 of the fully differential signal processing circuitry 1312. The adjustable gain device 1302 is a fully differential device because it includes both differential inputs and differential outputs.

In FIG. 13, the cross-coupled segment 1324 is shown as including an inductor component 1323 (which is a type of impedance component) having an adjustable inductance value L1$a$, and an inductor component 1325 having an adjustable inductance value L1$b$; and the cross-coupled segment 1326 is shown as including a inductor component 1329 having the adjustable inductance value L1$a$, and an inductor component 1327 having the adjustable inductance value L1$b$. Such inductor components are specific types of impedance components, and such inductance values are specific types of impedance values. The gain of the fully differential adjustable gain device 1302 is adjustable by adjusting the adjustable inductor value L1$a$ of each of the inductor component 1323 of the cross-coupled segment 1324 and the inductor component 1329 of the cross-coupled segment 1326, and adjusting the adjustable inductor value L1$b$ of each of the inductor component 1325 of the cross-coupled segment 1324 and the inductor component 1327 of the cross-coupled segment 1326. The impedance of each of the inductor components 1323 and 1329 is equal to $s*L1a$; and the impedance of each of the inductor components 1324 and 1327 is equal to $s*L1b$. The specified relationship between the component values of the cross-coupled segments 1324 and 1326 that is kept substantially constant (i.e., in order to keep the frequency response of the fully differential adjustable gain device 1302 substantially consistent, and keep the input impedance of the fully differential adjustable gain device 1302 substantially consistent) is the following Equation(8):

$$\frac{(L1a + L1b)}{L1a + L1b}.$$

While it would be preferred to adjust the gain of the various fully differential adjustable gain devices described herein while keeping the input impedance of the device absolutely constant and keeping the frequency response of the device absolutely consistent, in an actual implementation this would be very difficult if not impossible to achieve. Rather, what is achievable is acceptable is adjusting the gain of such a fully differential adjustable gain device while keeping the input impedance of the device substantially consistent and keeping the frequency response of the device substantially consistent. As noted above, the term "substantially constant" as used herein refers to within +/−10% of a specified value, and the term "substantially consistent" as used herein refers to within +/−10% of a response for a median gain setting. For example, if the specified input impedance for a device is 500 ohms, then keeping that input impedance substantially consistent would be keeping the input impedance within 500 ohms+/−10%, or more specifically, keeping the input impedance within the range of 450 ohms to 550 ohms. Similarly, in an actual implementation, keeping a specified relationship between component values of cross-coupled segments (e.g., 1124 and 1126 in FIG. 11) absolutely constant may also not be achievable. Rather, what is achievable and acceptable is keeping the specified relationship between component values of cross-coupled segments (e.g., 1124 and 1126 in FIG. 11) substantially constant, wherein the term "substantially constant" refers to within +/−10% of a specified value. For example, keeping the relationship represented in Equation(2) shown above substantially constant means keeping results of Equation(2) within +/−10% of a specified value. For example, if the result of Equation(2) for a median gain setting is the value 400, then for other gain settings that value should be kept within 400+/−10%, or more specifically, within the range of 360 and 440. In the above discussion of the embodiments of FIGS. 6-13, the term "constant" may be used for brevity but can be interpreted as meaning "substantially constant." Similarly, the term "the same" may be used for brevity but can be interpreted as meaning "substantially the same." Accordingly, where two impedance components are said to have "the same" impedance value, this can be interpreted as the two impedance components having substantially the same impedance value, and more specifically, be interpreted as the two impedance values being within +/−10% of a mean (i.e., average) of the impedance values for the two impedance components. For example, impedance values of 200 ohms and 210 ohms can be considered to be substantially the same, since both values are within +/−10% of the average of the two impedance values, i.e., within +/−10% of 205 ohms.

In the various embodiments described above with reference to FIGS. 6-13, impedance components that were described as having an adjustable impedance were shown and described as being either resistor components, capacitor components, or inductor components. It would also be possible that such impedance components are combinations of resistor, capacitor and/or inductor components. In other words, impedance components having an adjustable impedance can alternative be, e.g., RC components, RL components, RCL components, or CL components, but are not limited thereto.

Figure 14:
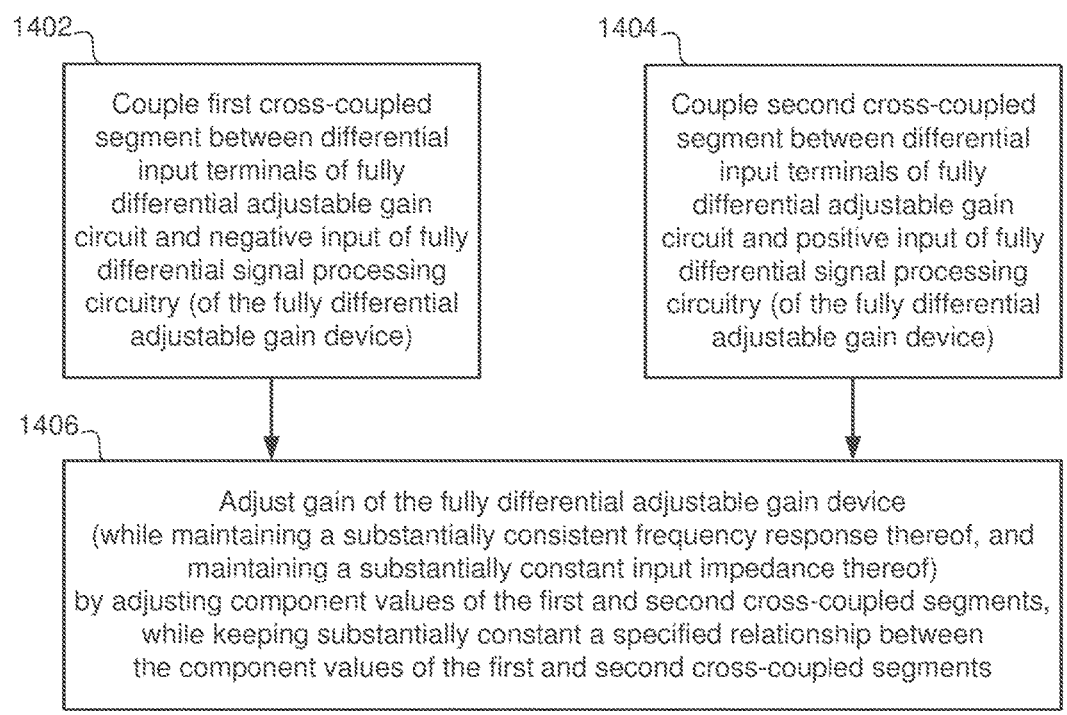
FIG. 14 is a high-level flow diagram that is used to summarize methods according to various embodiments of the present technology.

FIG. 14 is a high-level flow diagram that is used to summarize methods according to various embodiments of the present technology. Such methods are for use with a fully differential adjustable gain device (e.g., 602, 702, 802, 902, 1002, 1102, 1202, or 1302) that includes differential input terminals, differential output terminals, and fully differential signal processing circuitry (e.g., 612, 712, 812, 912, 1012, 1112, 1212, or 1301), wherein the fully differential signal processing circuitry includes differential inputs and differential outputs. A positive (+) output of the fully differential signal processing circuitry provides a positive (+) output terminal of the fully differential adjustable gain device. A negative (−) output of the fully differential signal processing circuitry provides the negative (−) output terminal of the fully differential adjustable gain device. Additional details of the fully differential adjustable gain devices with which such embodiments can be used are described above with reference to FIGS. 6-13.

Referring to FIG. 14, step 1402 involves coupling a first cross-coupled segment between the differential input terminals of the fully differential adjustable gain device and the negative (−) input of the fully differential signal processing circuitry. Step 1404 involves coupling a second cross-coupled segment between the differential input terminals of the fully differential adjustable gain device and the positive (+) input of the fully differential signal processing circuitry. Exemplary first and second cross-coupled segments, referred to in steps 1402 and 1404, include cross-coupled segments 624 and 626 in FIG. 6, cross-coupled segments 724 and 726 in FIG. 7, cross-coupled segments 824 and 826 in FIG. 8, cross-coupled segments 924 and 926 in FIG. 9, cross-coupled segments 1024 and 1026 in FIG. 10, cross-coupled segments 1124 and 1126 in FIG. 11, cross-coupled segments 1224 and 1226 in FIG. 12, and cross-coupled segments 1324 and 1326 in FIG.

Still referring to FIG. 14, step 1406 involves adjusting a gain of the fully differential adjustable gain device, while maintaining a substantially consistent frequency response and a substantially consistent input impedance of the fully differential adjustable gain device, by adjusting one or more component values of the first and second cross-coupled segments while keeping substantially constant a specified relationship between the component values of the first and second cross-coupled segments. The component values that are adjusted at step 1406 can be values of passive components of the first and second cross-coupled segments, each of which has a respective adjustable impedance value. Such impedance values can be, e.g., resistance values, capacitance values, inductance values, or combinations thereof, depending upon implementation. Further features of the methods summarized with reference to FIG. 14 can be appreciated from the above description of FIGS. 6-13.

It is understood that the present subject matter may be embodied in many different forms and should not be construed as being limited to the embodiments set forth herein. Rather, these embodiments are provided so that this subject matter will be thorough and complete and will fully convey the disclosure to those skilled in the art. Indeed, the subject matter is intended to cover alternatives, modifications and equivalents of these embodiments, which are included within the scope and spirit of the subject matter as defined by the appended claims. Furthermore, in the following detailed description of the present subject matter, numerous specific details are set forth in order to provide a thorough understanding of the present subject matter. However, it will be clear to those of ordinary skill in the art that the present subject matter may be practiced without such specific details.

Aspects of the present disclosure are described herein with reference to flowchart illustrations and/or block diagrams of methods, apparatuses (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable instruction execution apparatus, create a mechanism for implementing the functions/acts specified in the flowchart and/or block diagram block or blocks.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The aspects of the disclosure herein were chosen and described in order to best explain the principles of the disclosure and the practical application, and to enable others of ordinary skill in the art to understand the disclosure with various modifications as are suited to the particular use contemplated.

The disclosure has been described in conjunction with various embodiments. However, other variations and modifications to the disclosed embodiments can be understood and effected from a study of the drawings, the disclosure, and the appended claims, and such variations and modifications are to be interpreted as being encompassed by the appended claims. In the claims, the word "comprising" does not exclude other elements or steps, and the indefinite article "a" or "an" does not exclude a plurality.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

The foregoing detailed description has been presented for purposes of illustration and description. It is not intended to be exhaustive or to limit the subject matter claimed herein to the precise form(s) disclosed. Many modifications and variations are possible in light of the above teachings. The described embodiments were chosen in order to best explain the principles of the disclosed technology and its practical application to thereby enable others skilled in the art to best utilize the technology in various embodiments and with various modifications as are suited to the particular use contemplated. It is intended that the scope be defined by the claims appended hereto.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A fully differential adjustable gain device, comprising:
    differential input terminals of the fully differential adjustable gain device including a negative (−) input terminal and a positive (+) input terminal;
    differential output terminals of the fully differential adjustable gain device including a positive (+) output terminal and a negative (−) output terminal;
    fully differential signal processing circuitry including differential inputs and differential outputs, the differential inputs including a negative (−) input and a positive (+) input, the differential outputs including a positive (+) output and a negative (−) output;
    the positive (+) output of the fully differential signal processing circuitry providing the positive (+) output terminal of the fully differential adjustable gain device;
    the negative (−) output of the fully differential signal processing circuitry providing the negative (−) output terminal of the fully differential adjustable gain device;
    a first cross-coupled segment coupled between the differential input terminals of the fully differential adjustable gain device and the negative (−) input of the fully differential signal processing circuitry;
    a second cross-coupled segment coupled between the differential input terminals of the fully differential adjustable gain device and the positive (+) input of the fully differential signal processing circuitry; and
    the fully differential adjustable gain device having a gain that is adjustable by adjusting one or more component values of the first and second cross-coupled segments, while maintaining a substantially consistent frequency response and a substantially consistent input impedance of the fully differential adjustable gain device, so long as a specified relationship between the component values of the first and second cross-coupled segments is kept substantially constant.

2. The fully differential adjustable gain device of claim 1, wherein:
    the first cross-coupled segment includes a first passive component having a first adjustable component value and a second passive component having a second adjustable component value, the first passive component coupled between the negative (−) input terminal of the fully differential adjustable gain device and the negative (−) input of the fully differential signal processing circuitry, and the second passive component coupled between the positive (+) input terminal of the fully differential adjustable gain device and the negative (−) input of the fully differential signal processing circuitry; and
    the second cross-coupled segment includes a third passive component having the first adjustable component value and a fourth passive component having the second adjustable component value, the third passive component coupled between the positive (+) input terminal of the fully differential adjustable gain device and the positive (+) input of the fully differential signal processing circuitry, and the fourth passive component coupled between the negative (−) input terminal of the fully differential adjustable gain device and the positive (+) input of the fully differential signal processing circuitry.

3. The fully differential adjustable gain device of claim 2, wherein:
the first passive component of the first cross-coupled segment is a first impedance component having a first adjustable impedance value ($Z1a$);
the second passive component of the first cross-coupled segment is a second impedance component having a second adjustable impedance value ($Z1b$);
the third passive component of the second cross-coupled segment is a third impedance component having the first adjustable impedance value ($Z1a$);
the fourth passive component of the second cross-coupled segment is a fourth impedance component having the second adjustable impedance value ($Z1b$);
the gain of the fully differential adjustable gain device is adjustable by adjusting
the first adjustable impedance value ($Z1a$) of each of the first impedance component of the first cross-coupled segment and the third impedance component of the second cross-coupled segment, and
the second adjustable impedance value ($Z1b$) of each of the second impedance component of the first cross-coupled segment and the fourth impedance component of the second cross-coupled segment; and
the specified relationship between the component values of the first and second cross-coupled segments that is kept substantially constant comprises:

$$\frac{Z1a(s) * Z1b(s)}{Z1a(s) + Z1b(s)}$$

for each value of s, wherein s is a variable that represents complex frequency.

4. The fully differential adjustable gain device of claim 3, wherein:
the first impedance component is a first resistor component having a first adjustable resistance value ($R1a$), and thus, the first adjustable impedance value ($Z1a$) of the first impedance component is equal to $R1a$;
the second impedance component is a second resistor component having a second adjustable resistance value ($R1b$), and thus, the second adjustable impedance value ($Z1b$) of the second impedance component is equal to $R1b$;
the third impedance component is a third resistor component having the first adjustable resistance value ($R1a$), and thus, the first adjustable impedance value ($Z1a$) of the third impedance component is equal to $R1a$;
the fourth impedance component is a fourth resistor component having the second adjustable resistance value ($R1b$), and thus, the second adjustable impedance value ($Z1b$) of the fourth impedance component is equal to $R1b$;
the gain of the fully differential adjustable gain device is adjustable by adjusting the first adjustable resistance value ($R1a$) of each of the first resistor component of the first cross-coupled segment and the third resistor component of the second cross-coupled segment, and
the second adjustable resistance value ($R1b$) of each of the second resistor component of the first cross-coupled segment and the fourth resistor component of the second cross-coupled segment; and
the specified relationship between the component values of the first and second cross-coupled segments that is kept substantially constant comprises:

$$\frac{R1a * R1b}{R1a + R1b}.$$

5. The fully differential adjustable gain device of claim 3, wherein:
the first impedance component is a first capacitor component having a first adjustable capacitance value ($C1a$), and thus, the first adjustable impedance value ($Z1a$) of the first impedance component is equal to $1/(s*C1a)$;
the second impedance component is a second capacitor component having a second adjustable capacitance value ($C1b$), and thus, the second adjustable impedance value ($Z1b$) of the second impedance component is equal to $1/(s*C1b)$;
the third impedance component is a third capacitor component having the first adjustable capacitance value ($C1a$), and thus, the first adjustable impedance value ($Z1a$) of the third impedance component is equal to $1/(s*C1a)$;
the fourth impedance component is a fourth capacitor component having the second adjustable capacitance value ($C1b$), and thus, the second adjustable impedance value ($Z1b$) of the fourth impedance component is equal to $1/(s*C1b)$;
the gain of the fully differential adjustable gain device is adjustable by adjusting
the first adjustable capacitor value ($C1a$) of each of the first capacitance component of the first cross-coupled segment and the third capacitor component of the second cross-coupled segment, and
the second adjustable capacitance value ($C1b$) of each of the second capacitor component of the first cross-coupled segment and the fourth capacitor component of the second cross-coupled segment; and
the specified relationship between the component values of the first and second cross-coupled segments that is kept substantially constant comprises:

$$C1a + C1b.$$

6. The fully differential adjustable gain device of claim 3, wherein:
the first impedance component is a first inductor component having a first adjustable inductance value ($L1a$), and thus, the first adjustable impedance value ($Z1a$) of the first impedance component is equal to $(s*L1a)$;
the second impedance component is a second inductor component having a second adjustable inductance value ($L1b$), and thus, the second adjustable impedance value ($Z1b$) of the second impedance component is equal to $(s*L1b)$;
the third impedance component is a third inductor component having the first adjustable inductance value (L1a), and thus, the first adjustable impedance value (Z1a) of the third impedance component is equal to (s*L1a);

the fourth impedance component is a fourth inductor component having the second adjustable inductance value (L1b), and thus, the second adjustable impedance value (Z1b) of the fourth impedance component is equal to (s*L1b);

the gain of the fully differential adjustable gain device is adjustable by adjusting the first adjustable inductor value (L1a) of each of the first inductor component of the first cross-coupled segment and the third inductor component of the second cross-coupled segment, and the second adjustable inductance value (L1b) of each of the second inductor component of the first cross-coupled segment and the fourth inductor component of the second cross-coupled segment; and the specified relationship between the component values of the first and second cross-coupled segments that is kept substantially constant comprises:

$$\frac{(L1a + L1b)}{L1a + L1b}.$$

7. The fully differential adjustable gain device of claim 1, wherein the fully differential adjustable gain device comprises a fully differential filter.

8. The fully differential adjustable gain device of claim 7, wherein the fully differential filter comprises a multi-feedback (MFB) fully differential filter, and wherein the fully differential signal processing circuitry thereof includes a fully differential operational-amplifier (Op-Amp), a pair of feedback resistor components, and a pair of feedback capacitor components.

9. The fully differential adjustable gain device of claim 1, wherein the fully differential adjustable gain device comprises a fully differential variable gain amplifier (VGA), and wherein the fully differential signal processing circuitry thereof includes a fully differential operational-amplifier (Op-Amp), a pair of feedback resistor components and a pair of feedback capacitor components.

10. The fully differential adjustable gain device of claim 1, wherein the fully differential adjustable gain device comprises a fully differential continuous-time input sigma-delta analog-to-digital converter (ADC), or a fully differential mixer configured to perform at least one of frequency down-conversion or frequency up-conversion.

11. A method for use with a fully differential adjustable gain device, wherein the fully differential adjustable gain device includes differential input terminals of the fully differential adjustable gain device including a negative (−) input terminal and a positive (+) input terminal;

differential output terminals of the fully differential adjustable gain device including a positive (+) output terminal and a negative (−) output terminal;

fully differential signal processing circuitry including differential inputs and differential outputs, the differential inputs including a negative (−) input and a positive (+) input, the differential outputs including a positive (+) output and a negative (−) output;

the positive (+) output of the fully differential signal processing circuitry providing the positive (+) output terminal of the fully differential adjustable gain device;

the negative (−) output of the fully differential signal processing circuitry providing the negative (−) output terminal of the fully differential adjustable gain device;

the method comprising:

coupling a first cross-coupled segment between the differential input terminals of the fully differential adjustable gain device and the negative (−) input of the fully differential signal processing circuitry;

coupling a second cross-coupled segment between the differential input terminals of the fully differential adjustable gain device and the positive (+) input of the fully differential signal processing circuitry; and adjusting a gain of the fully differential adjustable gain device, while maintaining a substantially consistent frequency response and a substantially consistent input impedance of the fully differential adjustable gain device, by adjusting one or more component values of the first and second cross-coupled segments while keeping substantially constant a specified relationship between the component values of the first and second cross-coupled segments.

12. The method of claim 11, wherein:

the first cross-coupled segment includes a first passive component having a first adjustable component value and a second passive component having a second adjustable component value, the first passive component coupled between the negative (−) input terminal of the fully differential adjustable gain device and the negative (−) input of the fully differential signal processing circuitry, and the second passive component coupled between the positive (+) input terminal of the fully differential adjustable gain device and the negative (−) input of the fully differential signal processing circuitry;

the second cross-coupled segment includes a third passive component having the first adjustable component value and a fourth passive component having the second adjustable component value, the third passive component coupled between the positive (+) input terminal of the fully differential adjustable gain device and the positive (+) input of the fully differential signal processing circuitry, and the fourth passive component coupled between the negative (−) input terminal of the fully differential adjustable gain device and the positive (+) input of the fully differential signal processing circuitry; and the adjusting the gain of the fully differential adjustable gain device, while maintaining a substantially consistent frequency response and a substantially consistent input impedance of the fully differential adjustable gain device, comprises adjusting the first adjustable component value of each of the first passive component of the first cross-coupled segment and the third passive component of the second cross-coupled segment, and the second adjustable component value of each of the second passive component of the first cross-coupled segment and the fourth passive component of the second cross-coupled segment.

13. The method of claim 12, wherein:

the first passive component of the first cross-coupled segment is a first impedance component having a first adjustable impedance value (Z1a);

the second passive component of the first cross-coupled segment is a second impedance component having a second adjustable impedance value (Z1b);

the third passive component of the second cross-coupled segment is a third impedance component having the first adjustable impedance value (Z1a);

the fourth passive component of the second cross-coupled segment is a fourth impedance component having the second adjustable impedance value (Z1b);

the gain of the fully differential adjustable gain device is adjustable by adjusting the first adjustable impedance value (Z1a) of each of the first impedance component of the first cross-coupled segment and the third impedance component of the second cross-coupled segment, and the second adjustable impedance value (Z1b) of each of the second impedance component of the first cross-coupled segment and the fourth impedance component of the second cross-coupled segment; and the specified relationship between the component values of the first and second cross-coupled segments that is kept substantially constant comprises:

$$\frac{Z1a(s) * Z1b(s)}{Z1a(s) + Z1b(s)}$$

for each value of s, wherein s is a variable that represents complex frequency.

14. The method of claim 11, wherein the fully differential adjustable gain device, for which the method is used to adjust the gain, is selected from the group consisting of:
a fully differential low pass filter (LPF);
a fully differential bandpass filter (BPF);
a fully differential high pass filter (HPF); or
a fully differential variable gain amplifier (VGA).

15. The method of claim 11, wherein the fully differential adjustable gain device, for which the method is used to adjust the gain, comprises a fully differential continuous-time input sigma-delta analog-to-digital converter (ADC) or a fully differential mixer.

16. A receiver, comprising:
a low noise amplifier (LNA) configured to amplify a radio frequency (RF) signal;
a mixer downstream of the LNA and configured to frequency down-convert the RF signal following amplification thereof by the LNA; and
a fully differential adjustable gain device downstream of the mixer and configured to at least one of filter and amplify the RF signal following the frequency down-conversion thereof by the mixer, the fully differential adjustable gain device including:
differential input terminals of the fully differential adjustable gain device including a negative (−) input terminal and a positive (+) input terminal;
differential output terminals of the fully differential adjustable gain device including a positive (+) output terminal and a negative (−) output terminal;
fully differential signal processing circuitry including differential inputs and differential outputs, the differential inputs including a negative (−) input and a positive (+) input, the differential outputs including a positive (+) output and a negative (−) output;
the positive (+) output of the fully differential signal processing circuitry providing the positive (+) output terminal of the fully differential adjustable gain device;
the negative (−) output of the fully differential signal processing circuitry providing the negative (−) output terminal of the fully differential adjustable gain device;
a first cross-coupled segment coupled between the differential input terminals of the fully differential adjustable gain device and the negative (−) input of the fully differential signal processing circuitry;
a second cross-coupled segment coupled between the differential input terminals of the fully differential adjustable gain device and the positive (+) input of the fully differential signal processing circuitry; and
the fully differential adjustable gain device having a gain that is adjustable by adjusting one or more component values of the first and second cross-coupled segments, while maintaining a substantially consistent frequency response and a substantially consistent input impedance of the fully differential adjustable gain device, so long as a specified relationship between the component values of the first and second cross-coupled segments is kept substantially constant.

17. The receiver of claim 16, wherein:
the first cross-coupled segment of the fully differential adjustable gain device includes a first passive component having a first adjustable component value and a second passive component having a second adjustable component value, the first passive component coupled between the negative (−) input terminal of the fully differential adjustable gain device and the negative (−) input of the fully differential signal processing circuitry, and the second passive component coupled between the positive (+) input terminal of the fully differential adjustable gain device and the negative (−) input of the fully differential signal processing circuitry; and
the second cross-coupled segment of the fully differential adjustable gain device includes a third passive component having the first adjustable component value and a fourth passive component having the second adjustable component value, the third passive component coupled between the positive (+) input terminal of the fully differential adjustable gain device and the positive (+) input of the fully differential signal processing circuitry, and the fourth passive component coupled between the negative (−) input terminal of the fully differential adjustable gain device and the positive (+) input of the fully differential signal processing circuitry.

18. The receiver of claim 17, wherein:
the first passive component of the first cross-coupled segment of the fully differential adjustable gain device is a first impedance component having a first adjustable impedance value (Z1a);
the second passive component of the first cross-coupled segment of the fully differential adjustable gain device is a second impedance component having a second adjustable impedance value (Z1b);
the third passive component of the second cross-coupled segment of the fully differential adjustable gain device is a third impedance component having the first adjustable impedance value (Z1a);
the fourth passive component of the second cross-coupled segment of the fully differential adjustable gain device is a fourth impedance component having the second adjustable impedance value (Z1b);

the gain of the fully differential adjustable gain device is adjustable by adjusting the first adjustable impedance value ($Z1a$) of each of the first impedance component of the first cross-coupled segment and the third impedance component of the second cross-coupled segment, and the second adjustable impedance value ($Z1b$) of each of the second impedance component of the first cross-coupled segment and the fourth impedance component of the second cross-coupled segment; and the specified relationship between the component values of the first and second cross-coupled segments that is kept substantially constant comprises:

$$\frac{Z1a(s)*Z1b(s)}{Z1a(s)+Z1b(s)}$$

for each value of s, wherein s is a variable that represents complex frequency.

19. The receiver of claim 16, wherein the fully differential adjustable gain device, which is downstream of the mixer and is configured to at least one of filter and amplify the RF signal following the frequency down-conversion thereof by the mixer, is selected from the group consisting of:

a fully differential low pass filter (LPF);

a fully differential bandpass filter (BPF);

a fully differential high pass filter (HPF); or a fully differential variable gain amplifier (VGA).

20. The receiver of claim 16, wherein the receiver is included in user equipment or a base station that is configured to communicate data within a wireless network.

* * * * *